United States Patent
Hashim

(10) Patent No.: US 9,088,106 B2
(45) Date of Patent: Jul. 21, 2015

(54) COMMUNICATIONS JACKS HAVING FLEXIBLE PRINTED CIRCUIT BOARDS WITH COMMON MODE CROSSTALK COMPENSATION

(71) Applicant: CommScope, Inc. of North Carolina, Hickory, NC (US)

(72) Inventor: Amid I. Hashim, Plano, TX (US)

(73) Assignee: CommScope, Inc. of North Carolina, Hickory, NC (US)

( * ) Notice: Subject to any disclaimer, the term of this patent is extended or adjusted under 35 U.S.C. 154(b) by 113 days.

(21) Appl. No.: 13/894,041

(22) Filed: May 14, 2013

(65) Prior Publication Data

US 2014/0342610 A1    Nov. 20, 2014

(51) Int. Cl.
*H01R 13/6466*    (2011.01)
*H01R 24/64*    (2011.01)
*H05K 1/02*    (2006.01)
(Continued)

(52) U.S. Cl.
CPC ............ *H01R 13/6466* (2013.01); *H01R 24/64* (2013.01); *H05K 1/0228* (2013.01); *H05K 1/147* (2013.01); *H05K 1/0239* (2013.01); *H05K 1/0245* (2013.01); *H05K 1/117* (2013.01); *H05K 2201/09145* (2013.01); *H05K 2201/09672* (2013.01); *H05K 2201/10189* (2013.01); *H05K 2201/10363* (2013.01)

(58) Field of Classification Search
USPC .............................. 439/620.22, 676, 894, 941
See application file for complete search history.

(56) References Cited

U.S. PATENT DOCUMENTS 6,428,362 B1    8/2002    Phommachanh
6,641,443 B1    11/2003    Itano et al.
(Continued)

FOREIGN PATENT DOCUMENTS

WO    WO 2005/101579 A1    10/2005
WO    WO 2010/065588 A1    6/2010

OTHER PUBLICATIONS

Notification of Transmittal of the International Search Report and the Written Opinion of the International Searching Authority, or the Declaration, corresponding to PCT/US2014/022933, mailing date Jun. 10, 2014, 10 pages.

(Continued)

*Primary Examiner* — Alexander Gilman
(74) *Attorney, Agent, or Firm* — Myers Bigel Sibley & Sajovec, P.A.

(57) ABSTRACT

Communications jacks include a housing and a flexible printed circuit board that is at least partly within the housing. Eight input contacts that are mounted on the flexible printed circuit board, with the fourth and fifth input contacts forming a first differential pair, the first and second input contacts forming a second differential pair, the third and sixth input contacts forming a third differential pair, and the seventh and eighth input contacts forming a fourth differential pair. The plug contact regions of the input contacts are arranged in numerical order across a plug aperture of the jack. Eight output contacts are also provided, and the flexible printed circuit board includes conductive paths that electrically connect each input contact to a respective output contact. The fourth and fifth input contacts are mounted on the flexible printed circuit board at respective first and second mounting locations that are closer to a back end of the housing than are respective third and fourth mounting locations where the third and sixth input contacts are mounted on the flexible printed circuit board.

22 Claims, 8 Drawing Sheets

(51) Int. Cl.
*H05K 1/14* (2006.01)
*H05K 1/11* (2006.01)

(56) References Cited

U.S. PATENT DOCUMENTS

| | | | |
|---|---|---|---|
| 6,663,436 B1 * | 12/2003 | Arnett et al. | 439/676 |
| 6,736,681 B2 * | 5/2004 | Arnett | 439/676 |
| 7,179,131 B2 | 2/2007 | Caveney et al. | |
| 7,204,722 B2 | 4/2007 | Hashim et al. | |
| 7,223,115 B2 | 5/2007 | Hashim et al. | |
| 7,252,554 B2 | 8/2007 | Caveney et al. | |
| 7,281,957 B2 | 10/2007 | Caveney et al. | |
| 7,357,683 B2 * | 4/2008 | Caveney et al. | 439/894 |
| 7,442,092 B2 | 10/2008 | Caveney et al. | |
| 7,601,034 B1 * | 10/2009 | Aekins et al. | 439/676 |
| 7,618,296 B2 * | 11/2009 | Caveney | 439/676 |
| 7,670,193 B2 | 3/2010 | Milette et al. | |
| 7,736,195 B1 * | 6/2010 | Poulsen et al. | 439/676 |
| 7,824,231 B2 | 11/2010 | Marti et al. | |
| 7,837,513 B2 * | 11/2010 | Millette et al. | 439/676 |
| 7,850,492 B1 * | 12/2010 | Straka et al. | 439/676 |
| 7,976,348 B2 * | 7/2011 | Aekins et al. | 439/676 |
| 7,980,900 B2 * | 7/2011 | Hashim et al. | 439/676 |
| 8,011,972 B2 * | 9/2011 | Caveney et al. | 439/676 |
| 8,021,197 B2 * | 9/2011 | Milette et al. | 439/676 |
| 8,052,483 B1 * | 11/2011 | Straka et al. | 439/676 |
| 8,287,317 B2 * | 10/2012 | Straka et al. | 439/676 |
| 8,864,532 B2 * | 10/2014 | Larsen et al. | 439/676 |
| 2003/0232517 A1 | 12/2003 | Liu et al. | |
| 2007/0015417 A1 * | 1/2007 | Caveney et al. | 439/676 |
| 2007/0178772 A1 * | 8/2007 | Hashim et al. | 439/676 |
| 2007/0190863 A1 | 8/2007 | Caveney et al. | |
| 2008/0090467 A1 | 4/2008 | Caveney et al. | |
| 2008/0132123 A1 * | 6/2008 | Milette et al. | 439/676 |
| 2008/0166925 A1 * | 7/2008 | Caveney et al. | 439/676 |
| 2010/0041274 A1 | 2/2010 | Marti et al. | |
| 2010/0124855 A1 | 5/2010 | Milette et al. | |
| 2010/0159752 A1 * | 6/2010 | Siev et al. | 439/676 |
| 2010/0203763 A1 | 8/2010 | Hetzer et al. | |
| 2011/0065322 A1 | 3/2011 | Milette et al. | |
| 2011/0124219 A1 | 5/2011 | Milette et al. | |
| 2012/0156932 A1 | 6/2012 | Straka et al. | |
| 2012/0244752 A1 | 9/2012 | Patel et al. | |
| 2013/0225009 A1 * | 8/2013 | Hashim et al. | 439/676 |
| 2014/0073196 A1 * | 3/2014 | Hashim et al. | 439/676 |
| 2014/0073197 A1 * | 3/2014 | Fitzpatrick | 439/676 |

OTHER PUBLICATIONS

Pending Patent Application entitled, "Communications Jacks Having Flexible Printed Circuit Boards With Low-Coupling Jackwire Contacts Mounted Thereon," filed Mar. 14, 2013, U.S. Appl. No. 13/803,078.

Pending Patent Application entitled, "Communications Plugs and Patch Cords With Mode Conversion Control Circuitry," filed Mar. 14, 2013, U.S. Appl. No. 13/803,160.

* cited by examiner

US 9,088,106 B2

COMMUNICATIONS JACKS HAVING FLEXIBLE PRINTED CIRCUIT BOARDS WITH COMMON MODE CROSSTALK COMPENSATION

FIELD OF THE INVENTION

The present invention relates generally to communications connectors and, more particularly, to communications jacks.

BACKGROUND

Many hardwired communications systems use plug and jack connectors to connect a communications cable to another communications cable or to computer equipment. By way of example, high speed communications systems routinely use plug and jack connectors to connect computers, printers and other devices to local area networks and/or to external networks such as the Internet. FIG. 1 depicts a highly simplified example of such a hardwired high speed communications system that illustrates how plug and jack connectors may be used to interconnect a computer 11 to, for example, a network server 20.

As shown in FIG. 1, the computer 11 is connected by a cable 12 to a communications jack 15 that is mounted in a wall plate 19. The cable 12 is a patch cord that includes a communications plug 13, 14 at each end thereof. Typically, the cable 12 includes eight insulated conductors. As shown in FIG. 1, plug 14 is inserted into a cavity or "plug aperture" 16 in the front side of the communications jack 15 so that the contacts or "plug blades" of communications plug 14 mate with respective contacts of the communications jack 15. If the cable 12 includes eight conductors, the communications plug 14 and the communications jack 15 will typically each have eight contacts. The communications jack 15 includes a wire connection assembly 17 at the back end thereof that receives a plurality of conductors (e.g., eight) from a second cable 18 that are individually pressed into slots in the wire connection assembly 17 to establish mechanical and electrical connections between each conductor of the second cable 18 and a respective one of a plurality of conductive paths through the communications jack 15. The other end of the second cable 18 is connected to a network server 20 which may be located, for example, in a telecommunications closet. Communications plug 13 similarly is inserted into the plug aperture of a second communications jack (not pictured in FIG. 1) that is provided in the back of the computer 11. Thus, the patch cord 12, the cable 18 and the communications jack 15 provide a plurality of electrical paths between the computer 11 and the network server 20. These electrical paths may be used to communicate information signals between the computer 11 and the network server 20.

When a signal is transmitted over a conductor (e.g., an insulated copper wire) in a communications cable, electrical noise from external sources may be picked up by the conductor, degrading the quality of the signal. In order to counteract such noise sources, the information signals in the above-described communications systems are typically transmitted between devices over a pair of conductors (hereinafter a "differential pair" or simply a "pair") rather than over a single conductor. The two conductors of each differential pair are twisted tightly together in the communications cables and patch cords so that the eight conductors are arranged as four twisted differential pairs of conductors. The signals transmitted on each conductor of a differential pair have equal magnitudes, but opposite phases, and the information signal is embedded as the voltage difference between the signals carried on the two conductors of the pair. When the signal is transmitted over a twisted differential pair of conductors, each conductor in the differential pair often picks up approximately the same amount of noise from these external sources. Because the information signal is extracted by taking the difference of the signals carried on the two conductors of the differential pair, the subtraction process may mostly cancel out the noise signal, and hence the information signal is typically not disturbed.

Referring again to FIG. 1, it can be seen that a series of plugs, jacks and cable segments connect the computer 11 to the server 20. Each plug, jack and cable segment includes four differential pairs, and thus a total of four differential transmission lines are provided between the computer 11 and the server 20 that may be used to carry two way communications therebetween (e.g., two of the differential pairs may be used to carry signals from the computer 11 to the server 20, while the other two may be used to carry signals from the server 20 to the computer 11). The cascaded plugs, jacks and cabling segments shown in FIG. 1 that provide connectivity between two end devices (e.g., computer 11 and server 20) is referred to herein as a "channel." Thus, in most high speed communications systems, a "channel" includes four differential pairs. Unfortunately, the proximities of the conductors and contacting structures within each plug-jack connection (e.g., where plug 14 mates with jack 15) can produce capacitive and/or inductive couplings. These capacitive and inductive couplings in the connectors (and similar couplings that may arise in the cabling) give rise to another type of noise that is known as "crosstalk."

In particular, "crosstalk" refers to unwanted signal energy that is capacitively and/or inductively coupled onto the conductors of a first "victim" differential pair from a signal that is transmitted over a second "disturbing" differential pair. If the disturbing differential pair and the victim differential pair are part of the same channel, the crosstalk is often referred to as "internal" crosstalk. The crosstalk that is coupled onto the victim differential pair may include both near-end crosstalk (NEXT), which is the crosstalk measured at an input location corresponding to a source at the same location (i.e., crosstalk whose induced voltage signal travels in an opposite direction to that of an originating, disturbing signal in a different path), and far-end crosstalk (FEXT), which is the crosstalk measured at the output location corresponding to a source at the input location (i.e., crosstalk whose signal travels in the same direction as the disturbing signal in the different path). Both types of crosstalk comprise an undesirable noise signal that interferes with the information signal that is transmitted over the victim differential pair.

While methods are available that can significantly reduce the effects of crosstalk within communications cable segments, the communications connector configurations that were adopted years ago—and which still are in effect in order to maintain backwards compatibility—generally did not arrange the contact structures so as to minimize crosstalk between the differential pairs in the connector hardware. For example, pursuant to the ANSI/TIA-568-C.2 standard approved Aug. 11, 2009 by the Telecommunications Industry Association, in the connection region where the contacts of a modular plug mate with the contacts of the Modular jack (referred to herein as the "plug-jack mating region"), the eight contacts 1-8 of the jack must be aligned in a row, with the eight contacts 1-8 arranged as four differential pairs specified as depicted in FIG. 2. As known to those of skill in the art, under the TIA/EIA 568 type B configuration, contacts 4 and 5 in FIG. 2 comprise a first differential pair, contacts 1 and 2 comprise a second differential pair, contacts 3 and 6 comprise a third differential pair, and contacts 7 and 8 comprise a fourth differential pair. As is apparent from FIG. 2, this arrangement of the eight contacts 1-8 will result in unequal coupling between the differential pairs, and hence both NEXT and FEXT is introduced in each connector in industry standardized communications systems. The unequal coupling that occurs as a result of the industry standardized RJ-45 plug-jack interface is typically referred to as "offending" crosstalk.

As hardwired communications systems have moved to higher frequencies in order to support increased data rate communications, crosstalk in the plug and jack connectors has became a more significant problem. To address this problem, communications jacks now routinely include crosstalk compensation circuits that introduce "compensating" crosstalk that is used to cancel much of the "offending" crosstalk that is introduced in the plug-jack mating region as a result of the industry-standardized connector configurations. In order to ensure that plugs and jacks manufactured by different vendors will work well together, the industry standards specify amounts of offending crosstalk that must be generated between the various differential pair combinations in an RJ-45 plug for that plug to be industry-standards compliant. Thus, while it is now possible to manufacture RJ-45 plugs that exhibit much lower levels of offending crosstalk, it is still necessary to ensure that RJ-45 plugs inject the industry-standardized amounts of offending crosstalk between the differential pairs so that backwards compatibility will be maintained with the installed base of RJ-45 plugs and jacks. Typically, "multi-stage" crosstalk compensation circuits are used that use two or more stages of oppositely polarized compensating crosstalk to cancel an offending crosstalk signal. Various multi-stage crosstalk compensation circuits are described in U.S. Pat. No. 5,997,358 to Adriaenssens et al., the entire content of which is incorporated herein by reference as if set forth fully herein.

Crosstalk can be classified as either differential crosstalk or as common mode crosstalk. Differential crosstalk refers to a crosstalk signal that appears as a difference in voltage between two conductors of a victim differential pair. This type of crosstalk degrades any information signal carried on the victim differential pair as the difference in voltage does not subtract out when the information signal carried on the victim differential pair is extracted by taking the difference of the voltages carried by the conductors on the victim differential pair. Common mode crosstalk refers to a crosstalk signal that appears on both conductors of a differential pair. Common mode crosstalk typically does not disturb the information signal on the victim differential pair, as the disturbing common mode signal is cancelled by the subtraction process used to recover the information signal on the victim differential pair.

Common mode crosstalk, however, can generate another type of crosstalk called "alien" crosstalk. In contrast to internal crosstalk, alien crosstalk refers to crosstalk that occurs between two communication channels. Alien crosstalk can arise, for example, in closely spaced connectors (e.g., patch panels) or in communications cables that are bundled together. For example, a differential pair in a first communications cable can crosstalk with a differential pair in a second, immediately adjacent communications cable. Common mode signals that may be carried on a differential pair are particularly likely to generate alien crosstalk, as common mode signals are generally not self-cancelling in the way that differential signals are.

While many improvements have been achieved in crosstalk compensation, communications jacks that provide even further improved crosstalk performance are desired to enable higher data rate communications.

SUMMARY

Pursuant to embodiments of the present invention, communications jacks are provided that include a housing having a front end and a back end. A plug aperture is provided in the front end of the housing, and a flexible printed circuit board is at least partly within the housing. Eight input contacts that are mounted on the flexible printed circuit board so that the fourth and fifth input contacts form a first differential pair of input contacts, the first and second input contacts form a second differential pair of input contacts, the third and sixth input contacts form a third differential pair of input contacts, and the seventh and eighth input contacts form a fourth differential pair of input contacts. Each of the eight input contacts includes a plug contact region, and the plug contact regions of the first through eighth input contacts are arranged in numerical order across the plug aperture. These jacks also include eight output contacts that are electrically connected to the flexible printed circuit board, and the flexible printed circuit board include eight conductive paths that electrically connect the first through eighth input contacts to the respective first through eighth output contacts. The fourth and fifth input contacts are mounted on the flexible printed circuit board at respective first and second mounting locations that are closer to the back end of the housing than are respective third and fourth mounting locations where the third and sixth input contacts are mounted on the flexible printed circuit board.

In some embodiments, the third conductive path crosses over the sixth conductive path. A portion of the third conductive path may be configured to inductively couple with a portion of the seventh conductive path and/or with a portion of the eighth conductive path. A portion of the sixth conductive path may be configured to inductively couple with a portion of the second conductive path and/or with a portion of the first conductive path. The communications jack may be an RJ-45 jack and may have a second printed circuit board, and at least some of the eight input contacts may be mounted on the second printed circuit board.

In some embodiments, the second printed circuit board may be part of the flexible printed circuit board. The jack may also include a capacitive crosstalk compensation circuit that is connected between a non-signal current carrying end of the third input contact and a non-signal current carrying end of the fifth input contact and/or between a non-signal current carrying end of the fourth input contact and a non-signal current carrying end of the sixth input contact. The jack may also include eight dielectric contact carriers, and the eight input contacts may be mounted through the flexible printed circuit board into respective ones of the eight dielectric contact carriers. The jack may also include a spring, and at least one of the dielectric contact carriers may be interposed between one of input contacts and the spring.

In some embodiments, the first ends of the second, fourth, fifth and seventh jackwire contacts may be substantially aligned in a first row. First ends of the first, third, sixth and eighth jackwire contacts may be substantially aligned in a second row that is offset from the first row. The flexible printed circuit board may have a first cantilevered section and a second cantilevered section, and the third and fourth mounting locations may be on the first cantilevered section, and at least one of the first and second mounting locations may be on the second cantilevered section. The first cantilevered section may be cantilevered in a first direction and the second cantilevered section may be cantilevered in a second direction that is rotated from the first direction by at least forty-five degrees. The jack may also include an inductive crosstalk compensation circuit that is located on the first cantilevered section. This inductive crosstalk compensation circuit may generate inductive compensating crosstalk between the first differential pair of input contacts and the third differential pair of input contacts. The first through fourth mounting locations may each receive a signal current carrying end of the respective first through fourth input contacts.

Pursuant to further embodiments of the present invention, communications jacks are provided that include a housing having a plug aperture that has a longitudinal axis along which a mating plug is received and a transverse dimension which is perpendicular to the longitudinal axis. A flexible printed circuit board is at least partly within the housing. Eight jackwire contacts that are mounted on the flexible printed circuit board so that the fourth and fifth jackwire contacts form a first differential pair of jackwire contacts, the first and second jackwire contacts form a second differential pair of jackwire contacts, the third and sixth jackwire contacts form a third differential pair of jackwire contacts, and the seventh and eighth jackwire contacts form a fourth differential pair of jackwire contacts. Each of the eight jackwire contacts include a plug contact region, and the plug contact regions of the first through eighth jackwire contacts are arranged in numerical order across the plug aperture. The first ends of the third and sixth jackwire contacts are substantially aligned in a first transverse row across the plug aperture and the first ends of the fourth and fifth jackwire contacts are substantially aligned in a second transverse row that is longitudinally offset from the first transverse row.

In some embodiments, the first transverse row is closer to an opening into the plug aperture than is the second transverse row. The jack may also include a first conductive path on the flexible printed circuit board that is electrically connected to the third jackwire contact and a second conductive path on the flexible printed circuit board that is electrically connected to the seventh jackwire contact, where a section of the first conductive path is configured to inductively couple with a section of the second conductive path. The flexible printed circuit board may have a first cantilevered section and a second cantilevered section, and the first ends of the third and sixth jackwire contacts may be mounted on the first cantilevered section, and the first end of at least one of the fourth jackwire contact or the fifth jackwire contact may be mounted on the second cantilevered section. The first cantilevered section may be cantilevered in a first direction and the second cantilevered section may be cantilevered in a second direction that is rotated from the first direction by at least forty-five degrees. The jack may also include an inductive crosstalk compensation circuit that is located on the first cantilevered section that generates compensating inductive crosstalk between the first differential pair of jackwire contacts and the third differential pair of jackwire contacts. Additionally, the first end of the first jackwire contact and the first end of the eighth jackwire contact may be substantially aligned in the first transverse row and the first end of the second jackwire contact and the first end of the seventh jackwire contact may be substantially aligned in the second transverse row.

Pursuant to further embodiments of the present invention, communications jacks are provided that have a housing that includes a plug aperture and a flexible printed circuit board that is at least partly within the housing. The flexible printed circuit board has a front end that is adjacent the plug aperture and a rear end that is opposite the front end, and includes eight apertures. The jack also has eight jackwire contacts that each have a first end that is mounted in a respective one of the eight apertures, where the fourth and fifth jackwire contacts form a first differential pair of jackwire contacts, the first and second jackwire contacts form a second differential pair of jackwire contacts, the third and sixth jackwire contacts form a third differential pair of jackwire contacts, and the seventh and eighth jackwire contacts form a fourth differential pair of jackwire contacts. Each of the jackwire contacts includes a plug contact region, and the plug contact regions of the eight jackwire contacts are arranged in numerical order across the plug aperture. These jacks also include eight output contacts that are mounted in the flexible printed circuit board rearward of the eight jackwire contacts, and the flexible printed circuit board further includes eight conductive paths that electrically connect the respective first through eighth jackwire contacts to the respective first through eighth output contacts. The fourth conductive path extends from the fourth aperture toward the front end of the flexible printed circuit board and then reverses direction to extend toward the rear end of the flexible printed circuit board.

In some embodiments, the third conductive path crosses over the sixth conductive path. A portion of the third conductive path may be configured to inductively couple with a portion of at least one of the seventh conductive path and the eighth conductive path, and/or a portion of the sixth conductive path may be configured to inductively couple with a portion of at least one of the first conductive path and the second conductive path. The jack may also include a capacitive crosstalk compensation circuit that is connected between a non-signal current carrying end of the third jackwire contact and a non-signal current carrying end of the fifth jackwire contact. The jack may further include eight spring-biased dielectric contact carriers, and each of the jackwire contacts may be mounted through the flexible printed circuit board into a respective one of these dielectric contact carriers. The first ends of the second, fourth, fifth and seventh jackwire contacts may be substantially aligned in a first row, and the first ends of the first, third, sixth and eighth jackwire contacts may be substantially aligned in a second row that is offset from the first row. The flexible printed circuit board may have a first cantilevered section and a second cantilevered section, and the first ends of the third and sixth jackwire contacts may be mounted on the first cantilevered section, and the first ends of at least one of the fourth jackwire contact or the fifth jackwire contact may be mounted on the second cantilevered section.

Pursuant to further embodiments of the present invention, communications jacks are provided that have first and second jackwire contacts that form a first differential pair of jackwire contacts and third and fourth jackwire contacts that form a second differential pair of jackwire contacts. The first and second jackwire contacts are mounted on the first cantilevered section of a flexible substrate that has both first and second cantilevered sections.

In some embodiments, the third and fourth jackwire contacts are mounted on the second cantilevered section. The flexible substrate may also include a third cantilevered section, and the third jackwire contact may be mounted on the second cantilevered section and the fourth jackwire contact may be mounted on the third cantilevered section. The second cantilevered section may be within or may surround the first cantilevered section. The first cantilevered section may be cantilevered in a first direction and the second cantilevered section may be cantilevered in a second direction that is different from the first direction. The jack may also include an inductive crosstalk compensation circuit that is located on the first cantilevered section.

Pursuant to further embodiments of the present invention, communications jacks are provided that include a housing having a front end and a back end and a flexible printed circuit board that is at least partly within the housing. Eight jackwire contacts that are mounted on the flexible printed circuit board so that the fourth and fifth jackwire contacts form a first differential pair of jackwire contacts, the first and second jackwire contacts form a second differential pair of jackwire contacts, the third and sixth jackwire contacts form a third differential pair of jackwire contacts, and the seventh and eighth jackwire contacts form a fourth differential pair of jackwire contacts. Each of the eight jackwire contacts include a plug contact region, and the plug contact regions of the first through eighth jackwire contacts are arranged in numerical order across the plug aperture. Eight output contacts are also provided that are mounted in the flexible printed circuit board rearward of the jackwire contacts, the flexible printed circuit board further including eight conductive paths that electrically connect the respective first through eighth jackwire contacts to the respective first through eighth output contacts. The third and sixth conductive paths form an expanded loop on the flexible printed circuit board, and at least one of the third conductive path or the sixth conductive path does not cross over both the fourth conductive path and the fifth conductive path.

In some embodiments, the fourth and fifth jackwire contacts may be mounted on the flexible printed circuit board at respective first and second mounting locations that are closer to a back end of the housing than are respective third and fourth mounting locations where the third and sixth jackwire contacts are mounted on the flexible printed circuit board. The flexible printed circuit board may have a first cantilevered section and a second cantilevered section, and the third and sixth jackwire contacts may be mounted on the first cantilevered section.

DETAILED DESCRIPTION

Figure 1:
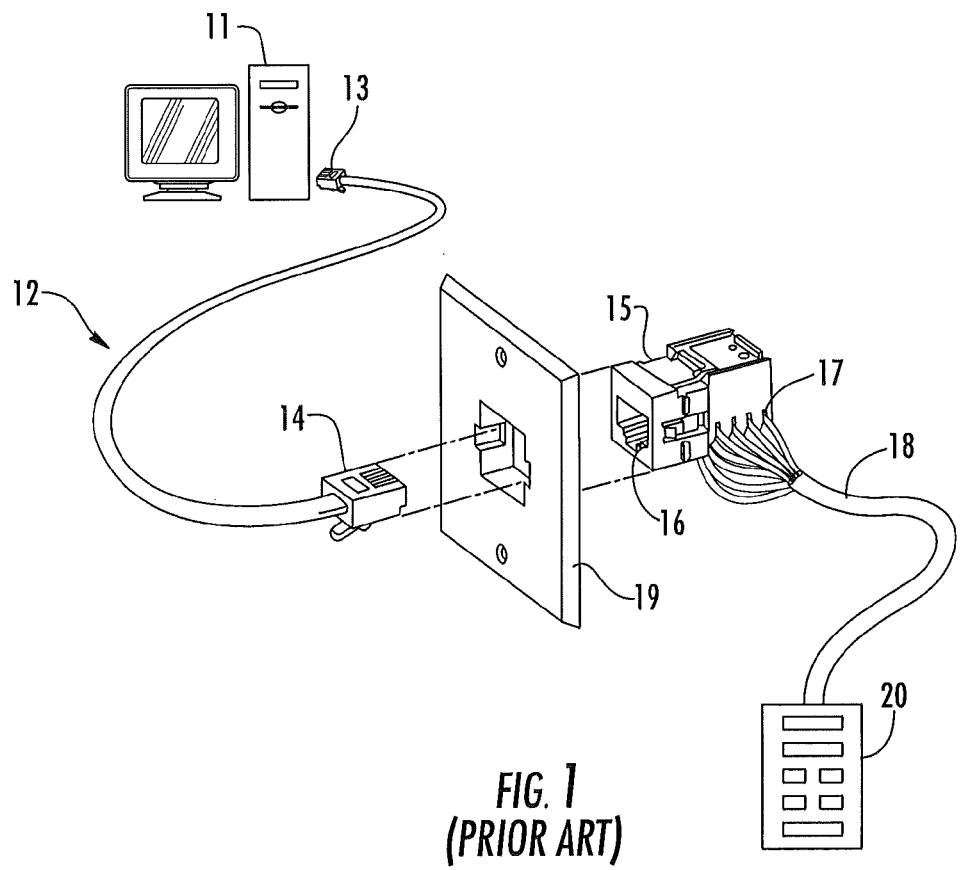
FIG. 1 is a schematic drawing that illustrates the use of communications plug and jack connectors to connect a computer to a network device.
Figure 2:
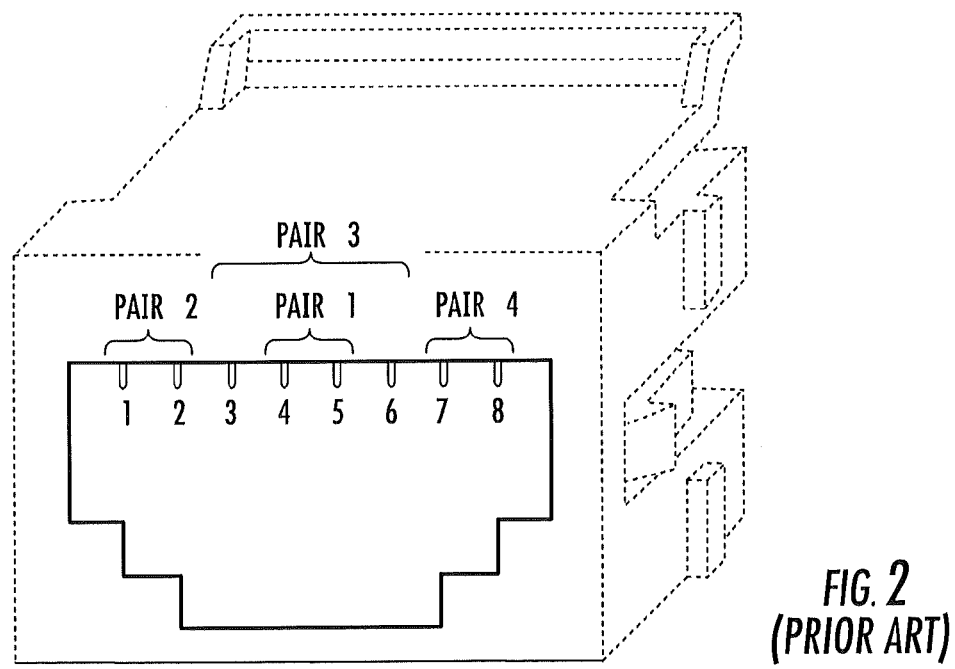
FIG. 2 is a schematic diagram illustrating the TIA/EIA 568 type B modular jack contact wiring assignments for a conventional 8-position communications jack as viewed from the front opening of the jack.

Pursuant to embodiments of the present invention, communications jacks such as RJ-45 jacks are provided that may exhibit both good differential and common mode crosstalk cancellation. The jacks according to embodiments of the present invention may have jackwire contacts that have very short signal current carrying paths (i.e., the physical distance that a communications signal travels when passing through a structure on the way to its destination) as compared to conventional spring jackwire contacts. This can both reduce the amount of crosstalk that is generated in the jackwire contacts and can reduce the time delay between the injection of the offending crosstalk and the injection of the compensating crosstalk, which can significantly improve the degree to which the offending crosstalk signal is cancelled, particularly at high frequencies. Additionally, the jacks may also include inductive common mode crosstalk compensation circuits between pairs 2 and 3 and between pairs 3 and 4 that inject common mode compensating crosstalk at a relatively small delay. These circuits may significantly improve the alien crosstalk performance of the jack (herein references to "pair 1", "pair 2", "pair 3" and "pair 4" refer to the four pairs specified in the above-reference TIA/EIA 568 type B configuration that is discussed above with respect to FIG. 2). This inductive crosstalk compensation may be implemented by crossing the conductive paths of pair 3 on the flexible printed circuit board immediately adjacent to the mounting locations on the flexible printed circuit board for the jackwire contacts of pair 3.

In some embodiments, the jackwire contacts may be mounted on a resilient substrate such as a flexible printed circuit board. A separate spring structure may be used to spring bias the jackwire contacts, thereby allowing the use of shorter jackwire contacts, while still ensuring that each jackwire contact maintains the requisite contact force against the respective blades of a mating communications plug. The flexible printed circuit board may include a plurality of cantilevered sections and the jackwire contacts may be mounted on these cantilevered sections so that each jackwire contact may deflect substantially independently of adjacent jackwire contacts when the jackwire contacts are engaged by the blades of a mating communications plug.

In some embodiments, the fourth and fifth jackwire contacts (i.e., pair 1) may be mounted on the flexible printed circuit board at mounting locations that are closer to the back end of the jack than are mounting locations where the third and sixth jackwire contacts (i.e., pair 3) are mounted on the flexible printed circuit board. By mounting the jackwire contacts of pair 3 forward of the jackwire contacts of pair 1 it may be possible to route the conductive paths for pair 3 so that they cross over each other on the flexible printed circuit without having either conductive path for pair 3 cross over both of the conductive paths for pair 1. This may allow the crossover on pair 3 to occur very close to the locations where the jackwire contacts for pair 3 are mounted on the flexible printed circuit board, which may facilitate implementing inductive common mode crosstalk compensation circuit between pairs 2 and 3 and between pairs 3 and 4 relatively close to the jackwire contacts.

In some embodiments, the jackwire contacts for pair 3 may be aligned in a first transverse row and the jackwire contacts for pair 1 may be aligned in a second transverse row that is longitudinally offset from the first transverse row. This unconventional arrangement may also facilitate crossing over the conductive paths for pair 3 at a very small delay from the locations where the jackwire contacts for pair 3 are mounted on the flexible printed circuit board.

In some embodiments, the flexible printed circuit board may have a first cantilevered section and a second cantilevered section. The rear ends of the jackwire contacts of pair 3 may both be mounted on the first cantilevered section, and the rear end of at least one of the jackwire contacts for pair 1 may be mounted on the second cantilevered section. In some embodiments, the second cantilevered section may be cantilevered in the opposite direction from the first cantilevered section and/or may extend from the first cantilevered section.

In some embodiments, the flexible printed circuit board may have eight conductive paths that electrically connect each jackwire contact of the jack to a respective output contact of the jack. The conductive paths of pair 3 may form an expanded loop on the flexible printed circuit board. Moreover, at least one of the conductive paths of pair 3 may not cross over both of the conductive paths of pair 1.

The communications jacks according to embodiments of the present invention have certain similarities to the communications jacks disclosed in U.S. patent application Ser. No. 13/803,078, filed Mar. 14, 2013, the entire content of which is incorporated herein by reference (herein "the '078 application"). However, the communications jacks according to the present embodiments may include a rapid crossover of the conductive paths of pair 3 on the flexible printed circuit board, thereby facilitating introducing inductive differential to common mode crosstalk compensation between pair 3 and pair 2 and between pair 3 and pair 4. This may improve the alien crosstalk performance of the communications jack, which may reduce or eliminate any need for shielding or other alien crosstalk reduction techniques.

Figure 3:
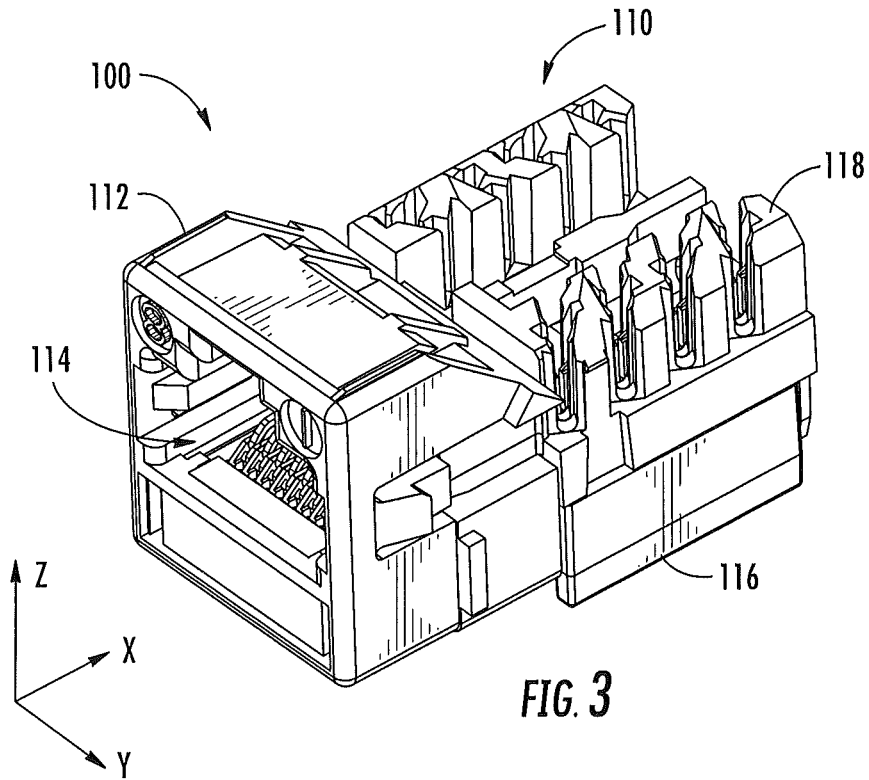
FIG. 3 is a perspective view of a communications jack according to embodiments of the present invention.
Figure 4A:
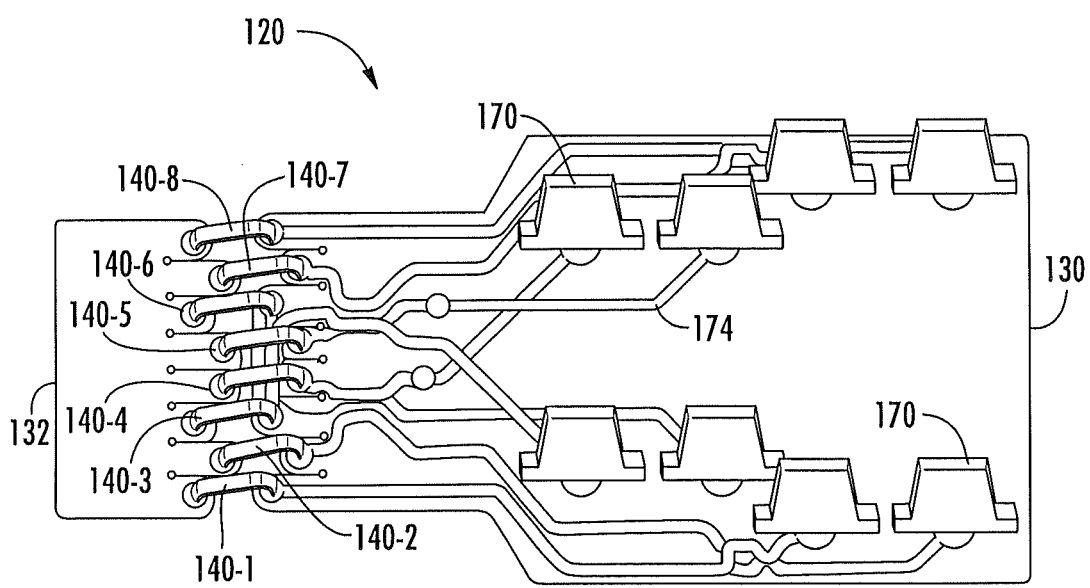
FIG. 4A is a schematic perspective view of a communications insert of the communications jack of FIG. 3.
Figure 4B:
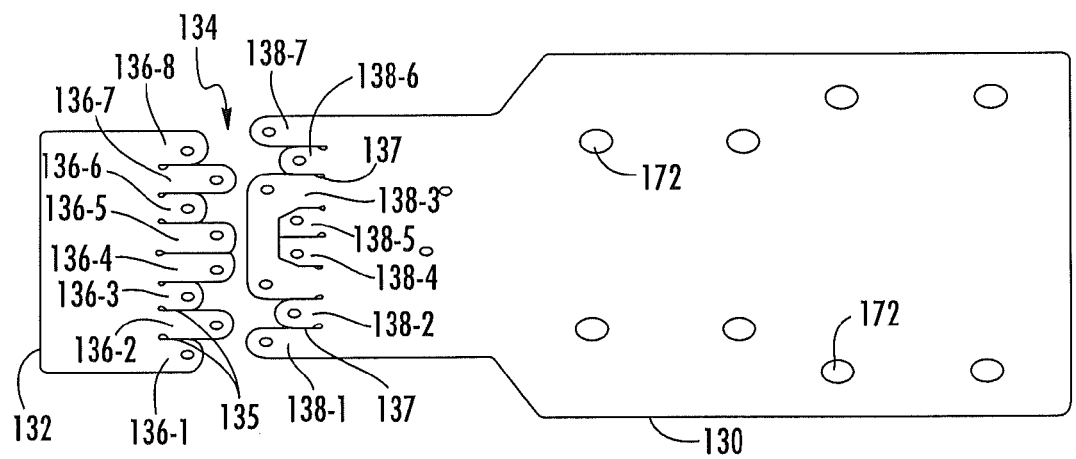
FIG. 4B is a schematic perspective view of a flexible printed circuit board of the communications insert of FIG. 4A with the traces removed.
Figure 4C:
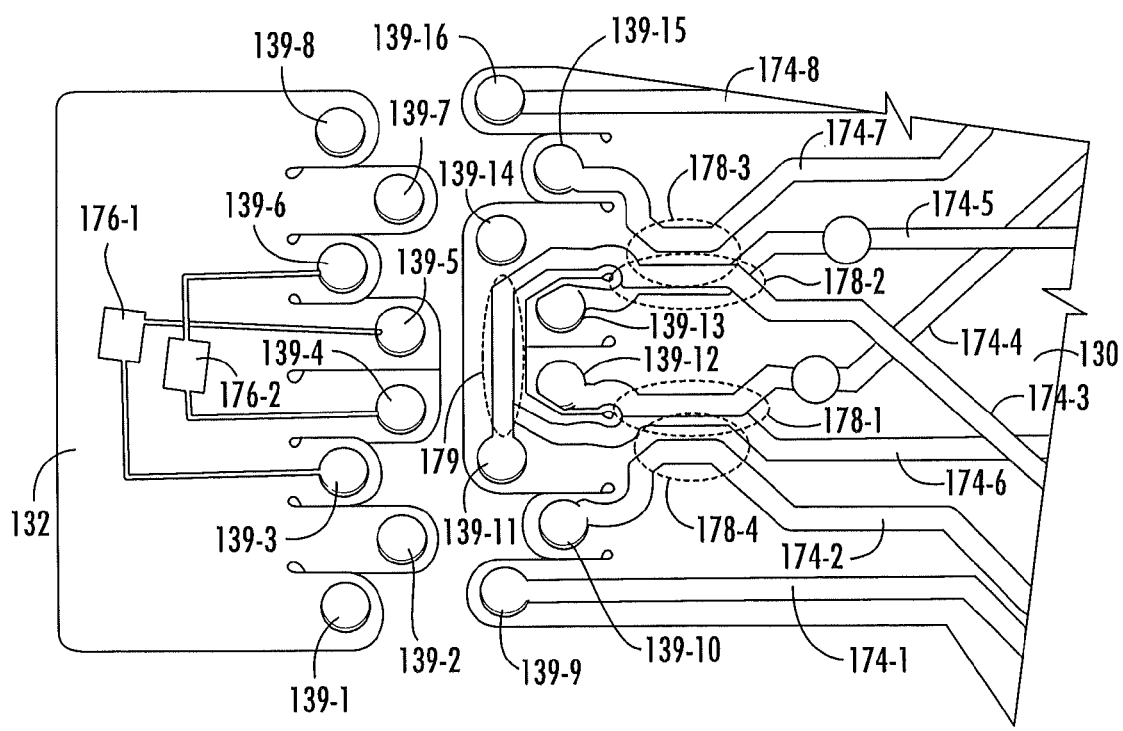
FIG. 4C is an enlarged view of the front portion of the flexible printed circuit board of the communications insert of FIG. 4A.
Figure 5:
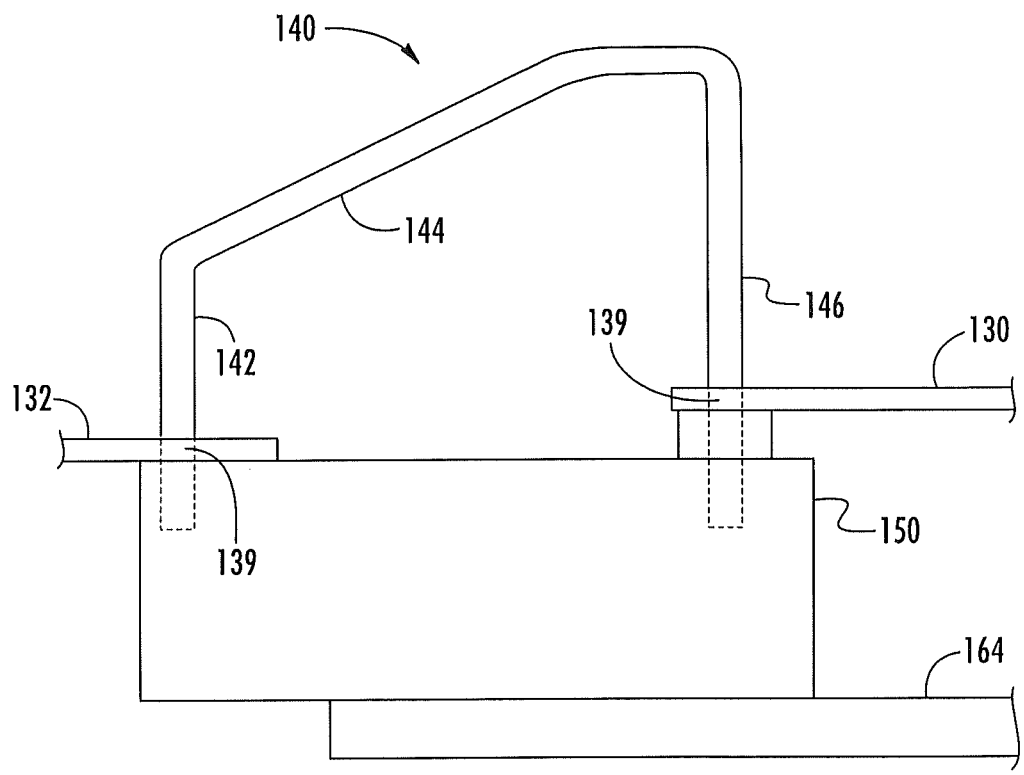
FIG. 5 is an enlarged side view of a jackwire contact of the communications insert of FIG. 4A that illustrates how the jackwire contact is mounted into a spring-biased contact carrier.
Figure 6:
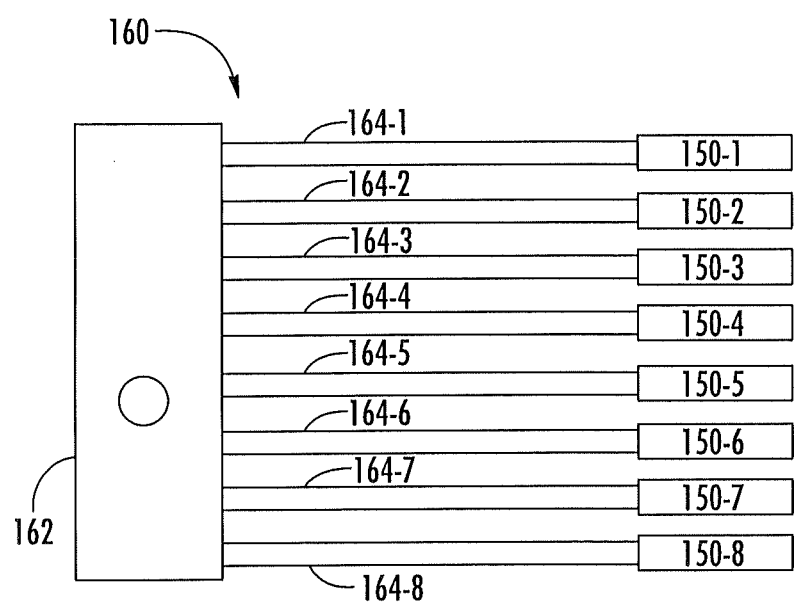
FIG. 6 is a schematic plan view of the contact carriers and a spring of the communications insert of FIG. 4A.

Embodiments of the present invention will now be described with reference to the accompanying drawings, in which example embodiments are shown. FIGS. 3-6 illustrate a communications jack according to embodiments of the present invention. In particular, FIG. 3 is a perspective view of the communications jack 100. FIG. 4A is a schematic perspective view of a communications insert 120 for the communications jack 100. FIG. 4B is a schematic perspective view of two flexible printed circuit boards 130, 132 of the communications insert 120 of FIG. 4A with the traces removed therefrom. FIG. 4C is an enlarged view of the front portion of the flexible printed circuit boards 130, 132. FIG. 5 is a side view of a jackwire contact of the communications insert 120 that illustrates how the jackwire contact is mounted through the flexible printed circuit boards 130, 132 into a spring-biased dielectric contact carrier. Finally, FIG. 6 is a schematic plan view of the spring biased dielectric contact carriers of the communications insert of 120.

As shown in FIG. 3, the jack 100 includes a housing 110. In the depicted embodiment, the housing 110 includes a jack frame 112, a cover 116 and a terminal housing 118. The jack frame 112 includes a plug aperture 114 for receiving a mating communications plug. The housing components 112, 116, 118 may be conventionally formed and need not be described in detail herein. Those skilled in this art will recognize that other configurations of jack frames, covers and terminal housings may also be employed with the present invention, and that the housing 110 may have more or less than three pieces. It will also be appreciated that the jack 100, when mounted for use, is typically rotated 180 degrees about its longitudinal axis from the orientation shown in FIG. 3. In the discussion that follows, the x-direction in FIG. 3 is referred to as the longitudinal direction, the y-direction in FIG. 3 is referred to as the transverse direction, and the z-direction in FIG. 3 is referred to as the vertical direction. In the discussion that follows, the relationships of the components of jack 100 with respect to each other will be described with respect to the orientation illustrated in the figures for convenience.

FIG. 4A illustrates various components of a communications insert 120 of the jack 100. The forward portion of the communications insert 120 is received within an opening in the rear of the jack frame 112. The bottom of the communications insert 120 is protected by the cover 116, and the top of the communications insert 120 is covered and protected by the terminal housing 118. The communications insert 120 includes a flexible printed circuit board 130, a second printed circuit board 132, a plurality of jackwire contacts 140, a plurality of dielectric contact carriers 150 (see FIG. 6), a spring 160 (see FIG. 6) and a plurality of output contacts 170, each of which will be discussed in further detail below. A substrate (not shown in the figures) may be provided in some embodiments that may be disposed between the cover 116 and the flexible printed circuit board 130. FIG. 4B is a schematic perspective view of the flexible printed circuit board 130 and the second printed circuit board 132 that more clearly illustrates the slit pattern and contact mounting locations thereof. FIG. 4C is an enlarged view of the front portion of the flexible printed circuit board 130 and the second printed circuit board 132.

The flexible printed circuit board 130 may be positioned within the housing 110. As shown in FIG. 4A, the flexible printed circuit board 130 may comprise an elongated printed circuit board that is formed of a flexible material. The second printed circuit board 132 may also be a flexible printed circuit board or may comprise a conventional rigid printed circuit board. In some embodiments, the second printed circuit board 132 may be replaced with one or more dielectric mounting substrates. In the depicted embodiment, the second printed circuit board 132 comprises a flexible printed circuit board 132. It will be appreciated that in many embodiments either a single large printed circuit board may be used or two (or more) separate printed circuit boards may be used. Thus, it will be appreciated that in some embodiments the first and second printed circuit boards 130, 132 may be two printed circuit boards, whereas in other embodiments they may be implemented as separate regions of the same printed circuit board.

The flexible printed circuit board 130 and/or the flexible printed circuit board 132 may each include one or more dielectric layers that may have conductive traces and/or other elements disposed on one or both sides thereof, as is known to those of skill in the art. The flexible printed circuit board 130 may be used as a transmission medium for signals that pass between the jackwire contacts 140 (which serve as the input contacts to the jack 100) and the respective output contacts 170 of the jack 100, as will be explained in more detail below. The flexible printed circuit board 130 and/or the flexible printed circuit board 132 may also include a plurality of crosstalk compensation circuits disposed thereon or therein, as will also be discussed in more detail below.

As is also shown in FIG. 4A, eight low coupling jackwire contacts 140-1 through 140-8 are mounted on the printed circuit boards 130, 132. Herein, a "jackwire contact" refers to a conductive contact structure of the jack that is mounted in or on a structure so as to extend into the plug aperture of the jack. Moreover, when the communications jacks according to embodiments of the present invention include multiple of the same components, these components may be referred to individually by their full reference numerals (e.g., jackwire contact 140-4) and may be referred to collectively by the first part of their reference numeral (e.g., the jackwire contacts 140). The jackwire contacts 140 are configured as four differential pairs of jackwire contacts 140 that may be used to carry four separate differential signals through the jack 100. In particular, jackwire contacts 140-4 and 140-5 form a first differential pair of jackwire contacts, jackwire contacts 140-1 and 140-2 form a second differential pair of jackwire contacts, jackwire contacts 140-3 and 140-6 form a third differential pair of jackwire contacts, and jackwire contacts 140-7 and 140-8 form a fourth differential pair of jackwire contacts.

FIG. 5 is a schematic side view of a representative jackwire contact 140 that illustrates how the jackwire contact 140 is mounted on the flexible printed circuit boards 130, 132. As shown in FIG. 5, each jackwire contact 140 has a first end 142, a second end 146 and a middle section 144. The middle section 144 includes a "plug contact region" (i.e., the portion of the jackwire contact 140 that engages the blade of a mating plug that is received within the plug aperture 114 of jack 100). As can be seen in FIG. 4A, the plug contact regions of jackwire contacts 140-1 through 140-8 are arranged in a transverse row in numerical order across the plug aperture 114.

The jackwire contacts 140 may be formed of, for example, a resilient metal such as beryllium-copper or phosphor-bronze, or a non-resilient metal such as copper or gold-plated copper. In some embodiments, the jackwire contacts 140 may comprise substantially rigid contacts, meaning that the jackwire contacts 140 do not flex more than a de minimis amount when engaged by the respective blades of a mating plug during normal use of the jack 100.

As shown in FIG. 5, the first end 142 of each jackwire contact 140 is mounted into a respective one of a plurality of metal-plated apertures 139 that are provided in the flexible printed circuit board 132. Similarly, the second end 146 of each jackwire contact 140 is mounted into a respective one of a plurality of metal-plated apertures 139 that are provided in the flexible printed circuit board 130. Thus, the metal-plated apertures 139 serve as mounting locations for the first and second ends 142, 144 of the jackwire contacts 140, and the jackwire contacts 140 are mounted on the flexible printed circuit boards 130, 132 by having the ends thereof extend through the apertures 139. The first and second ends 142, 146 of the jackwire contacts 140 can be mounted into their respective metal-plated apertures 139-1 through 139-16 (see FIG. 4C) by any conventional means such as, for example, welding, soldering or including compliant pin terminations on the ends 142, 146 of each jackwire contact 140. In this fashion, the first end 142 and the second end 146 of each jackwire contact 140 may be electrically connected to conductive structures on the flexible printed circuit boards 130, 132 in order to allow electrical signals (and electrical power) to pass between the flexible printed circuit boards 130, 132 and the respective jackwire contacts 140.

As is shown in FIGS. 5 and 6, the communications insert 120 includes eight dielectric contact carriers 150-1 through 150-8 (only one of the contact carriers 150 is visible in FIG. 5). Herein, a "contact carrier" refers to a structure that provides mechanical support to a jackwire contact. The dielectric contact carriers 150 may be identical or similar to the dielectric contact carriers 150 that are disclosed in the above-referenced '078 application. In the depicted embodiment, each contact carrier 150 comprises an elongated, generally planar strip of molded plastic. Each contact carrier 150 extends parallel to the longitudinal axis of the jack 100, and each contact carrier 150 may be longitudinally aligned with a respective one of the jackwire contacts 140. The contact carriers 150 are aligned side-by-side in a row (in numerical order) in the lateral direction. The first end 142 of each jackwire contact 140 extends through the flexible printed circuit board 132 into a first aperture in a top surface of the contact carrier 150 that is positioned underneath the jackwire contact 140. The second end 146 of each jackwire contact 140 extends through the flexible printed circuit board 130 into a second aperture in a top surface of the contact carrier 150 that is positioned underneath the jackwire contact 140. Thus, the first end 142 of each jackwire contact 140 may be mounted on and through the flexible printed circuit board 132 into its corresponding contact carrier 150, and the second end 146 of each jackwire contact 140 may be mounted on and through the flexible printed circuit board 130 into its corresponding contact carrier 150.

FIG. 6 illustrates how each contact carrier 150 may be spring-biased by a spring 160. As shown in FIG. 6, the spring 160 may comprise a comb-like structure that has a base 162 and eight tines 164-1 through 164-8. The spring 160 may be implemented as a piece of resilient metal such as beryllium-copper or phosphor-bronze that is mounted, for example, to the housing 110 by any appropriate means. However, it will be appreciated that a wide variety of different materials may be used to form the spring 160, including other metals, plastics, etc., and it will also be appreciated that the spring 160 may be implemented in many different forms (e.g., as a coiled spring, a cantilevered spring, etc.). In the illustrated embodiment, a single spring 160 that has eight independently moveable tines 164 is provided that is used for all eight jackwire contacts 140, but it will be appreciated that in other embodiments more than one spring 160 may be provided (e.g., a separate spring 160 could be provided for each of the jackwire contacts 140).

As is further shown in FIG. 6, each of the contact carriers 150 may be mounted directly on top of a respective one of the eight tines 164 of spring 160.

Accordingly, each tine 164 of the spring 160 is connected to a respective one of the jackwire contacts 140 (not shown in FIG. 6) through a respective one of the contact carriers 150. Each tine 164 of the spring 160 may "spring bias" its associated contact carrier 150 and jackwire contact 140 so that when the contact carrier 150 and jackwire contact 140 are pressed down a spring force is applied that urges the contact carrier 150 and jackwire contact 140 upwardly to return to their normal resting positions. As the ends 142, 146 of each jackwire contact 140 are mounted in a respective one of the contact carriers 150, each dielectric contact carrier 150 and its respective jackwire contact 140 will move together as a single unit when a communications plug is inserted into the plug aperture 114 of jack 100 and physically engages the jackwire contacts 140.

Referring again to FIGS. 4A-4B, it can be seen that the flexible printed circuit board 130 and the flexible printed circuit board 132 are separated by a transversely-extending gap 134. Each jackwire contact 140 spans the transverse gap 134. A plurality of slots 135 are provided in the flexible printed circuit board 132 that define eight rearwardly facing cantilevered sections 136-1 through 136-8, each of which extends generally longitudinally to form a cantilevered finger. Likewise, seven longitudinal slots 137 are provided in the flexible printed circuit board 130 that define a plurality of forwardly facing cantilevered sections 138-1 through 138-7. Cantilevered sections 138-1 through 138-2 and 138-4 through 138-7 are in the form of fingers, while cantilevered section 138-3 is in the form of a U-shaped member (that has a wide base) that is cantilevered from two separate locations. Cantilevered section 138-3 surrounds cantilevered fingers 138-4 and 138-5.

The cantilevered sections 136, 138 may move relatively independent of each other such that each section 136 may be depressed a different distance downwardly when the jack 100 is mated with a communications plug. The ability of each finger/section 136, 138 to move relatively independent of the other fingers 136, 138 may improve the performance and reliability of the jack 100.

In particular, various industry standards specify certain physical characteristics that must be met for a communications plug to qualify as an industry-standardized communications plug. The physical characteristics specified in these standards include the distances that portions of the plug blades must be from the bottom and front surfaces of the plug housing, and the industry standards specify ranges for these distances to accommodate manufacturing tolerances. Because ranges are specified, a communications plug may be industry-standard compliant even though its plug blades are not all the same distance from the bottom and/or front surfaces of the plug housing (i.e., the blades may be offset from each other in the longitudinal direction and/or the vertical direction).

When a communications plug that has plug blades that are offset from each other due to such manufacturing tolerances is inserted into the jack 100, then some of the plug blades may engage their respective jackwire contacts 140 of jack 100 sooner than other of the plug blades. The subset of the jackwire contacts 140 that are initially engaged in this fashion exert a downward force on the flexible printed circuit boards 130, 132. If the flexible printed circuit boards 130, 132 did not include the fingers 136, 138, then when the lower positioned plug blades engaged their corresponding jackwire contacts 140 the printed circuit boards 130, 132 would be pushed downwardly, thereby pulling the remaining (not yet engaged) jackwire contacts 140 downward as well, pulling these jackwire contacts 140 away from their respective plug blades. As a result, some of the jackwire contacts 140 would exert a greater contact force against their respective plug blades (namely the jackwire contacts 140 that are initially contacted by the offset plug blades) than would other of the jackwire contacts 140, such that some plug blades may not even engage their respective jackwire contacts 140 or may engage them with insufficient contact force to comply with the industry standards. By including the fingers 136, 138 on the flexible printed circuit boards 130, 132, the degree to which the movement of a first of the jackwire contacts 140 changes the position of other of the jackwire contacts 140 may be reduced, and hence the jack 100 may be less susceptible to performance degradation when used with plugs that have plug blades that are offset from each other in the longitudinal and/or vertical directions.

As shown in FIG. 5, in the depicted embodiment, the first end 142 of each jackwire contact 140 may each be mounted to be substantially perpendicular to a top surface of the flexible printed circuit board 132, and the second end 146 of each jackwire contact 140 may each be mounted to be substantially perpendicular to a top surface of the flexible printed circuit board 130. The middle portion 144 of each jackwire contact 140 may be raised above either or both of the top surfaces of the flexible printed circuit boards 130, 132 and may extend across the transversely-extending gap 134. In some embodiments, the middle portion 144 of each jackwire contact 140 may define an oblique angle with respect to a plane that is defined by the top surface of the flexible printed circuit board 130.

In some embodiments, all of the jackwire contacts 140 may have the same profiles. This may simplify the manufacturing process and may also reduce production costs. However, in other embodiments the jackwire contacts 140 may have different profiles. The jackwire contact profiles may be designed to reduce coupling between adjacent jackwire contacts 140 by reducing the size of the region where adjacent jackwire contacts 140 are close to each other.

Referring to FIGS. 3, 4A, 5 and 6, operation of the spring 160 will now be described. When a mating plug is received within the plug aperture 114, the plug blades deflect each respective jackwire contact 140 and its associated contact carrier 150 downwardly. The contact carriers 150, in turn, deflect each of the eight tines 164 of spring 160 downwardly. As the spring 160 is resilient, the tines 164 exert an upward force on their respective contact carriers 150, thereby forcing each of the jackwire contacts 140 upwardly to ensure that each jackwire contact 140 engages its mating plug blade with sufficient contact force to ensure that a reliable electrical connection is maintained between the eight blades of the mating plug and the jackwire contacts 140 with which they respectively mate. The spring 160 may be electrically isolated and physically separated by the contact carriers 150 from the jackwire contacts 140 (and hence is not part of the signal current carrying paths or the crosstalk compensation features that extend from them).

As the resiliency of the spring 160 provides the contact force (through the contact carriers 150) that presses the jackwire contacts 140 against the respective blades of a mating plug, the jackwire contacts 140 need not be mounted in cantilevered fashion, nor must they be resilient. This is in contrast to most conventional RJ-45 communications jacks, which typically include elongated spring jackwire contacts that are formed of beryllium-copper or phosphor-bronze. These conventional spring jackwire contacts may be sufficiently resilient such that they will meet industry standardized specifications with respect to the contact force that they apply to a mating plug blade while not becoming permanently deformed with use. Typically, relatively long spring jackwire contacts must be used in order to ensure that the requisite contact force is applied to a mating plug blade. The jackwire contacts 140 that may be included in communications jacks according to embodiments of the present invention may be significantly shorter, since they are spring-biased by a separate spring. As a result, the signal current carrying path through each of the jackwire contacts 140 (which extends from the middle region 144 of the jackwire contact 140 to the second end 146 of the jackwire contact 140) may be very short in length, which can significantly reduce the amount of coupling between adjacent jackwire contacts 140, and hence the amount of offending crosstalk that is generated. For example, the jackwire contacts 140 may each be about 200 mils to about 230 mils in length, which is much shorter than typical conventional jackwire contacts which may range, for example, from about 400 mils to about 800 mils in length, or even more.

While not shown in the drawings, a plurality of guiding walls may be provided in, for example, the jack housing 110 that define a plurality of guiding slots therebetween. A portion of each of the contact carriers 150 may be positioned in a respective one of these slots. Each contact carrier 150 may move up and down within its respective slot in response to the insertion or removal of a mating plug, and the slots act to maintain each of the contact carriers 150, and hence the jackwire contacts 140 mounted thereon, in their proper transverse alignment within the plug aperture 114 in order to maintain the jackwire contacts 140 at desired distances from each other and to ensure that the jackwire contacts 140 are properly aligned with their mating plug blades.

Referring again to FIG. 4A, it can be seen that the jackwire contacts 140 are substantially aligned in two rows in the transverse direction. In particular, jackwire contacts 140-1, 140-3, 140-6 and 140-8 are mounted in a first transverse row and jackwire contacts 140-2, 140-4, 140-5 and 140-7 are mounted in a second transverse row that is longitudinally offset toward the rear of the jack 100 from the first transverse row. Likewise, the first ends 142 of jackwire contacts 140-1, 140-3, 140-6 and 140-8 are mounted in a first transverse row and the second ends 146 of jackwire contacts 140-1, 140-3, 140-6 and 140-8 are mounted in a second transverse row that is longitudinally offset toward the rear of the jack 100 from the first transverse row so that the first transverse row is closer to an opening into the plug aperture 114 than is the second transverse row.

The staggered arrangement of the jackwire contacts 140 may improve the crosstalk performance of the jack 100, as the stagger further reduces the amount of offending crosstalk that is generated between the different differential pairs of jackwire contacts 140. By way of example, in the plug-jack mating region, typically jackwire contact 140-2 (which is part of pair 2) will couple a greater amount of signal energy onto jackwire contact 140-3 (which is part of pair 3) than will jackwire contact 140-1 (which is the other jackwire contact of pair 2), as jackwire contact 140-2 is directly adjacent to jackwire contact 140-3, while jackwire contact 140-1 is positioned farther away from jackwire contact 140-3. Consequently, this unequal coupling by the conductors of pair 2 onto pair 3 results in offending crosstalk from pair 2 onto pair 3 (and vice versa). By staggering jackwire contact 140-2 with respect to jackwire contacts 140-1 and 140-3 (i.e., by moving jackwire contact 140-2 rearwardly into the second row), the amount of coupling between jackwire contact 140-2 and 140-3 can be reduced without significantly effecting the amount of coupling between jackwire contact 140-1 and 140-3, thus reducing the amount of offending crosstalk that is generated between pair 2 and pair 3. Similar beneficial reductions in the amount of offending crosstalk may be achieved between pairs 3 and 4.

The stagger arrangement in the jack 100 of FIGS. 3-6 may not reduce the generation of offending crosstalk between jackwire contacts 140 as much as some other stagger arrangements, such as the jackwire contact arrangement disclosed in the aforementioned '078 application. In particular, in the jack 100, the jackwire contacts 140-4, 140-5 of pair 1 are not staggered with respect to each other, nor are the jackwire contacts 140-3, 140-6 of pair 3. While this arrangement may result in an increase in the amount of crosstalk generated between pairs 1 and 3 in the jackwire contacts 140 of jack 100 relative to the arrangement disclosed in the '078 application, the crosstalk cancellation performance for jack 100 is expected to still be very high, and suitable for the vast majority of applications. Moreover, the change from the jackwire contact stagger pattern of the '078 application to the jackwire contact stagger pattern disclosed herein may have other advantages, particularly with respect to the reduction of alien crosstalk, as will be discussed in greater detail below.

As shown in FIG. 4A, a plurality of output contacts 170 are also mounted on the flexible printed circuit board 130. The output contacts 170 are also in electrical contact with the flexible printed circuit board 130. In this particular embodiment, the eight output contacts 170 are implemented as insulation displacement contacts (IDCs) that are mounted in respective metal-plated apertures 172 (see FIG. 4B) in the flexible printed circuit board 130. The mounting posts for the IDCs 170 may extend through the flexible printed circuit board 130 into a mounting substrate (not shown). As is well known to those of skill in the art, an IDC is a type of wire connection terminal that may be used to make mechanical and electrical connection to an insulated wire conductor. The IDCs 170 may be of conventional construction and need not be described in detail herein. Any other appropriate output contact may be used including, for example, insulation piercing contacts.

The flexible printed circuit board 130 may act as a signal carrying structure that passes signals between the eight jackwire contacts 140 and their corresponding output contacts 170. In particular, as is shown in FIGS. 4A and 4C, a plurality of conductive paths 174-1 through 174-8 are provided in or on the flexible printed circuit board 130. Each conductive path 174 connects a respective one of the metal-plated apertures 174 to a corresponding one of the metal-plated apertures 172 in order to provide eight conductive paths through the flexible printed circuit board 130. Each conductive path 174 may be formed, for example, as a unitary conductive trace that resides on a single layer of the flexible printed circuit board 130 or as two or more conductive traces that are provided on multiple layers of the flexible printed circuit board 130 and which are electrically connected through metal-filled vias, tubular metal vias or other layer transferring techniques known to those of skill in the art. The conductive traces 174 may be formed of conventional conductive materials such as, for example, copper, and are deposited on the flexible printed circuit board 130 via any deposition method known to those skilled in this art.

The communications jacks according to embodiments of the present invention may exhibit excellent internal crosstalk performance and alien crosstalk performance as compared to many conventional communications jacks.

In particular, as is known to those of skill in the art, modern communications jacks such as RJ-45 jacks typically include single-stage or multi-stage crosstalk compensation circuits that are designed to inject "compensating" crosstalk that cancels out "offending" crosstalk that is injected between two differential pairs in a mated communications jack and plug combination due to industry-standardized configurations of the plug blades and the jackwire contacts. However, the compensating crosstalk typically cannot be inserted at precisely the same location where the offending crosstalk is injected, and thus the compensating crosstalk is typically injected at some delay after the offending crosstalk. Unfortunately, for communications signals at higher frequencies (e.g., at frequencies above 100 MHz and, even more so for frequencies above 250 MHz or 500 MHz), a significant phase shift may occur because of the delay between the locations where the offending and compensating crosstalk are injected, and because of this phase shift, the compensating crosstalk will not completely cancel out the offending crosstalk.

In an effort to address this problem caused by the delay, the aforementioned '358 patent teaches methods of using multi-stage crosstalk compensation in communications jacks that may, theoretically, completely cancel out an offending crosstalk signal having a specific frequency. However, since the frequency of the communications signals that traverse a plug-jack connection are typically not known in advance, the techniques of the '358 patent may provide good, but not perfect, crosstalk cancellation at other frequencies. Moreover, because of the aforementioned phase shifts, all other things being equal, better crosstalk performance can typically be achieved the less offending crosstalk that is generated and the closer in time the compensating crosstalk is injected to the point where the offending crosstalk is injected.

As is known to those of skill in the art, crosstalk compensation circuits are typically implemented in communications jacks such as RJ-45 jacks as capacitive crosstalk compensation circuits and as inductive crosstalk compensation circuits. Capacitive crosstalk compensation circuits are most typically implemented as plate capacitors and/or as interdigitated finger capacitors that are implemented, for example, on a printed circuit board of the jack or in the jackwire contacts of the jack, although other capacitive crosstalk compensation circuits may be used. Inductive crosstalk compensation circuits are most typically implemented as conductive paths that run side-by-side next to each other, either in the jackwire contacts or as conductive traces on a printed circuit board of the jack. Typically, it is desirable to implement the crosstalk compensation scheme using both inductive crosstalk compensation circuits and capacitive crosstalk compensation circuits so that both near end crosstalk and far end crosstalk can be cancelled.

A plurality of crosstalk compensation circuits 176, 178 such as, for example, interdigitated finger capacitors, plate capacitors, inductively coupling traces and the like may be provided in the jack 100 according to embodiments of the present invention. In particular, as shown best in FIG. 4C, two exemplary capacitive crosstalk compensation circuits 176-1, 176-2 in the form of plate capacitors (only the upper plate of each plate capacitor is visible) are provided on flexible printed circuit board 132 that inject capacitive crosstalk compensation between pairs 1 and 3 (these circuits are not shown in FIG. 4A to simplify the drawing). Notably, these capacitive crosstalk compensation circuits 176-1, 176-2 are attached to the first ends 142 of the jackwire contacts, and hence are not on the signal current carrying path through the jack 100. Consequently, circuits 176-1, 176-2 may inject capacitive crosstalk compensation at a very small delay from the plug-jack mating point, as the effective electrical delay may be significantly reduced when the capacitive crosstalk compensation is not on the signal current carrying path. While the embodiment depicted in the figures only shows capacitive differential crosstalk compensation circuits attached between pairs 1 and 3, it will be appreciated that additional crosstalk compensation circuits may be provided. Such additional capacitive differential crosstalk compensation may be between other pair combinations, may be either on the non signal current carrying path or the signal current carrying path, and/or may be first stage or second (or later) stage crosstalk compensation.

The jack 100 is also designed to inject inductive differential crosstalk compensation at a short delay from the plug-jack mating point. In order to reduce or minimize the delay, the inductive crosstalk compensation circuits may be implemented in the flexible printed circuit board 130 very close to the second ends 146 of the jackwire contacts 140 (i.e., very close to the metal-plated vias 139 that receive the second ends 146 of the jackwire contacts 140). Here, the inductive differential crosstalk compensation is provided in the jack 100 by the inductive crosstalk compensation circuits 178-1, 178-2, each of which is formed by running two of the conductive traces on surfaces of the flexible printed circuit board 130 close to each other so that the traces inductively couple. For example, as shown in FIG. 4C, the inductive differential crosstalk compensation circuit 178-2 is formed by routing conductive path 174-3 to run on the top surface of flexible printed circuit board 130 so that it is directly (or nearly directly) above conductive path 174-5, which is routed on the bottom side of the flexible printed circuit board 130. While a small degree of delay is inevitable due to the distance separating the plated-metal via 139-11 that holds the second end 146 of jackwire contact 140-3 and the plated-metal via 139-13 that holds the second end 146 of jackwire contact 140-5, it can be seen from FIGS. 4A and 4C that the inductive differential crosstalk compensation circuit 178-2 is at a relatively small delay from the plug contact region of jackwire contacts 140-3 and 140-5. Moreover, as the flexible printed circuit board 130 may be very thin (e.g., only 1 mil thick), a large amount of inductive coupling can be achieved in circuit 178-2 in a very short distance. This further facilitates minimizing the delay. It is likewise apparent from FIG. 4C that the inductive differential crosstalk compensation circuit 178-1, which is formed by routing conductive path 174-4 to run on the top surface of flexible printed circuit board 130 so that it is directly (or nearly directly) above conductive path 174-6, which is routed on the bottom side of the flexible printed circuit board 130, will also inject inductive differential crosstalk compensation at a relatively short delay.

As discussed above, when a common mode crosstalk signal is present on a differential pair, it can give rise to alien crosstalk. One effective way of preventing such alien crosstalk is to use shielded cables and connectors, which can greatly reduce crosstalk between closely adjacent channels. However, shielded communications systems may be more expensive, heavier, and/or more labor intensive to install, and hence it generally is preferable if an unshielded communications system may be used.

In RJ-45 communications jacks, the most significant common mode crosstalk is typically generated on pairs 2 and 4 when pair 3 receives a differential signal due to the large separation between the jackwire contacts and plug blades for pair 3. For example, the signal that is carried on jackwire contact 140-6 will couple heavily onto jackwire contacts 140-7 and 140-8 (pair 4), while the signal carried on jackwire contact 140-3 will couple onto jackwire contacts 140-7 and 140-8 to a far lesser extent (and hence will not substantially cancel out the signal coupled from jackwire contact 140-6). As a result, a common mode signal from jackwire contact 140-6 may be induced onto the pair 4. While this common mode signal may not significantly interfere with the signal on pair 4 (since it should be substantially cancelled in the subtraction process used to recover the signal on pair 4), it may couple into differential pairs of other channels causing alien crosstalk.

One method for reducing such common mode crosstalk is to include a crossover in the conductive paths for pair 3 in the jack. This crossover allows the conductive path for jackwire contact 140-3 to be brought close to the conductive paths for pair 4, and allows the conductive path for jackwire contact 140-6 to be brought close to the conductive paths for pair 2. In some case, this crossover may be implemented in the jackwire contacts as is disclosed, for example, in U.S. Pat. No. 7,204,722. However, implementing the crossover in the jackwire contacts typically requires longer jackwire contacts which, as discussed above, may increase the delay before compensating crosstalk may be introduced, and may also introduce mechanical issues in implementing a reliable crossover. Alternatively, the pair 3 crossover may be implemented, for example, on the printed circuit board of a communications jack. Thus, in the communications jack 100, this may be accomplished by having conductive paths 174-3 and 174-6 cross over each other.

As discussed above, it is desirable to implement this pair 3 crossover very close to the jackwire contacts 140 so that the coupling between conductive path 174-3 and the conductive paths 174-7 and 174-8 of pair 4 may occur as soon as practical. However, this may be difficult to achieve because the portion of the flexible printed circuit board 130 that receives the signal current carrying ends 146 of the jackwire contacts 140 tends to be very crowded due to the metal-plated vias 139-9 through 139-16 that receive the jackwire contacts, the slits 137 that form the cantilevered sections (and note that a conductive trace cannot cross a slit 137) and the fact that all eight conductive paths 174 necessarily terminate into this region. To form a crossover in pair 3, it is typically necessary to have the conductive paths for pair 3 on the printed circuit board cross over the conductive paths 174-4, 174-5 of pair 1, which will typically require yet additional vias (to move conductive paths between the top and bottom surfaces of the flexible printed circuit board 130 to implement the crossovers), which requires additional space. The net effect is that it can difficult to implement the pair 3 crossover at a short delay (which is generally necessary of this approach is to be very effective at substantially reducing alien crosstalk).

Pursuant to embodiments of the present invention, it has been realized that various techniques may be used that may make it easier to implement a pair 3 crossover on, for example, a flexible printed circuit board, and thus may allow for introduction of common mode crosstalk compensation between pairs 2 and 3 and between pairs 3 and 4 at shorter delays. Various of these techniques will now be described with reference to FIGS. 4A-4C.

In particular, two inductive common mode crosstalk compensation circuits 178-3, 178-4 are provided in jack 100. As shown best in FIG. 4C, inductive crosstalk compensation circuit 178-3 is formed by running conductive path 174-3 very close to the conductive path 174-7 of pair 4. Similarly, inductive common mode crosstalk compensation circuit 178-4 is formed by running conductive path 174-6 very close to the conductive path 174-2 of pair 2. As is readily apparent from FIGS. 4A and 4C, the inductive common mode crosstalk compensation circuits 178-3, 178-4 are implemented at a relatively short delay from the vias 139 that hold the second ends 146 of the relevant jackwire contacts 140.

One aspect of the design of jack 100 that facilitates shortening the delay is that the signal current carrying ends 146 of jackwire contacts 140-4 and 140-5 of pair 1 are positioned to the rear of the signal current carrying ends 146 of jackwire contacts 140-3 and 140-6 of pair 3. As a result of this arrangement, conductive paths 174-3 and 174-6 are able to crossover each other in a region 179 of flexible printed circuit board 130 without any need to (1) cross over one of the slits 137 or (2) cross over the conductive paths 174-4, 174-5 of pair 1.

Another aspect of the design of jack 100 that facilitates shortening the delay is the fact that the second ends 146 of jackwire contacts 140-3 and 140-6 of pair 3 are located on the same cantilevered section 138-3. If this were not the case, then the presence of at least one additional slit 137 could potentially be in the way and prevent implementing the crossover of conductive paths 174-3 and 174-6 immediately adjacent the vias 139-11 and 139-14.

Another aspect of the design of jack 100 that facilitates shortening the delay is the fact that the conductive paths 174-3 and 174-6 of pair 3 form an expanded loop on the flexible printed circuit board 130. In particular, conductive paths 174-3 and 174-6 cross over each other in two places on the flexible printed circuit board 130, and a wide "expanded" loop is defined between these two crossover locations. Moreover, this expanded loop is formed in a manner so that at least one of the conductive paths 174-3, 174-6 does not cross over both of the conductive paths 174-4, 174-5 of pair 1. This can be accomplished for example, by having conductive paths 174-3 and 174-6 cross over each other forward of the apertures 139-12, 139-13 that hold the signal current carrying ends of the jackwire contacts 140-4, 140-5. By reducing the number of times that the conductive paths 174-3 and 174-6 of pair 3 must cross the conductive paths 174-4 and 174-5 of pair 1, the number of conductive vias through the flexible printed circuit board may be reduced, which may provide more room in the very crowded section of the flexible printed circuit board 130 that is adjacent the conductive vias 139-11 through 139-14. Freeing up this additional space in this crowded region of the flexible printed circuit board 130 may facilitate implementing the inductive common mode crosstalk compensation circuits 178-3 and 178-4 at a smaller delay from the jackwire contacts 140.

Figure 7A:
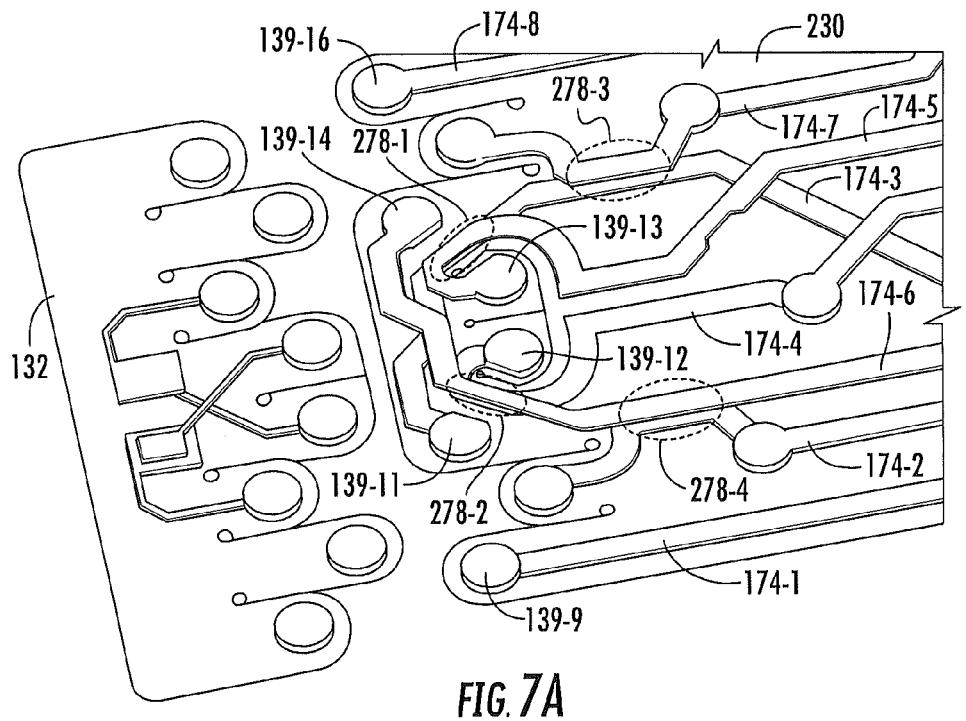
FIG. 7A is a schematic perspective view of a flexible printed circuit board according to further embodiments of the present invention that may be used in the communications jack of FIG. 3.
Figure 7B:
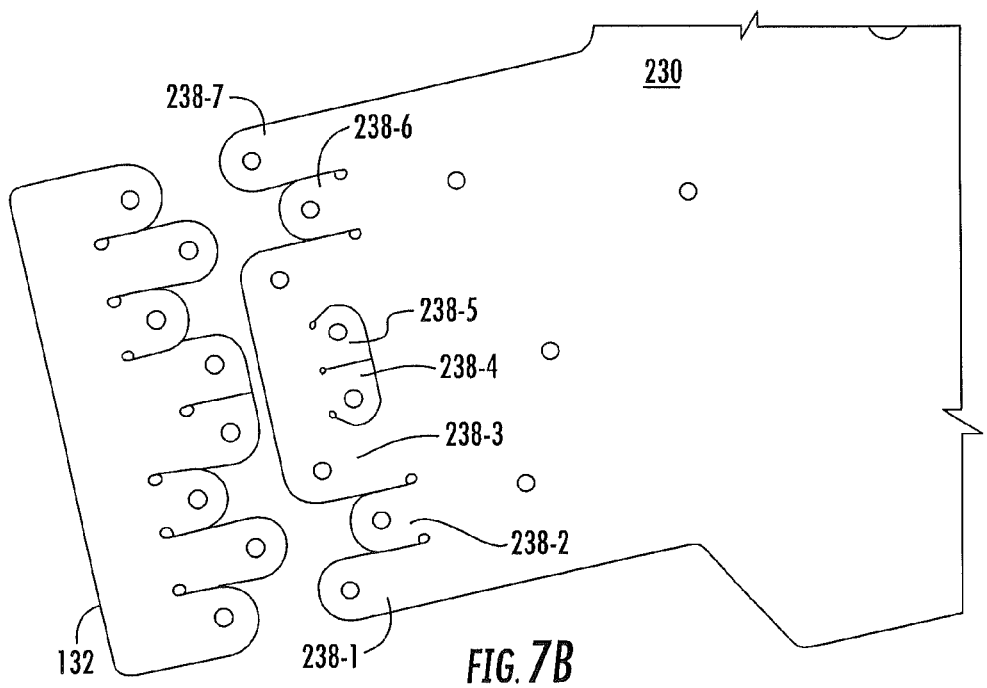
FIG. 7B is a schematic perspective view of the flexible printed circuit board of FIG. 7A with the traces removed.

FIG. 7A is a schematic perspective view of flexible printed circuit board 132 and a portion of a flexible printed circuit board 230 according to further embodiments of the present invention. FIG. 7B is an identical view of the flexible printed circuit boards 132, 230 of FIG. 7A with the conductive traces and crosstalk compensation circuits omitted to more clearly illustrate the slit pattern in the printed circuit board that is used to form the cantilevered fingers/sections. As flexible printed circuit board 132 has already been discussed above with respect to FIGS. 4A-4C, further discussion thereof will be omitted here.

The flexible printed circuit board 230 may be used in place of the flexible printed circuit board 130 in jack 100. As the flexible printed circuit board 230 and the flexible printed circuit board 130 are quite similar, the discussion that follows will focus on differences between these two printed circuit board configurations. The flexible printed circuit board 230 may be used in the communications insert 120 discussed above in conjunction with the flexible printed circuit board 132, the jackwire contacts 140, the dielectric contact carriers 150, the spring 160 and the output contacts 170 that are discussed above.

As shown in FIG. 7B, the flexible printed circuit board 230 differs from the flexible printed circuit board 130 in that the cantilevered fingers 238-4 and 238-5 face in the opposite direction as compared to the cantilevered fingers 138-4 and 138-5 that are provided in flexible printed circuit board 130. As a result, cantilevered fingers 238-4 and 238-5 are actually cantilevered from cantilevered section 238-3 and may be considered to be within cantilevered section 238-3. As a result of this design, conductive path 174-4 extends from metal-plated aperture 139-12 toward the front end of flexible printed circuit board 230 (i.e., toward flexible printed circuit board 132) and then loops around to extend toward the rear end of flexible printed circuit board 230. Similarly, conductive path 174-5 extends from metal-plated aperture 139-13 toward the front end of flexible printed circuit board 230 and then loops around to extend toward the rear end of flexible printed circuit board 230. This design may have several unique advantages, as follows.

First, in the flexible printed circuit board 230, inductive differential crosstalk compensation is provided between pairs 1 and 3 via crosstalk compensation circuits 278-1 and 278-2. Similar to circuits 178-1 and 178-2 of flexible printed circuit board 130 that are discussed above, crosstalk compensation circuit 278-1 is implemented by overlapping conductive paths 174-3 and 174-5 and crosstalk compensation circuit 278-2 is implemented by overlapping conductive paths 174-4 and 174-6. However, as is readily apparent from a comparison of FIG. 4C and FIG. 7A, crosstalk compensation circuits 278-1 and 278-2 are located significantly closer to the vias 139-11 through 139-14 than are crosstalk compensation circuits 178-1 and 178-2. Consequently, the design of flexible printed circuit board 230 will introduce inductive differential crosstalk compensation between pairs 1 and 3 at a shorter delay, which may result in more effective crosstalk cancellation.

Second, in flexible printed circuit board 230, inductive crosstalk compensation is provided for cancelling the common mode crosstalk that is typically generated on pairs 2 and 4 when pair 3 receives a differential signal via crosstalk compensation circuits 278-3 and 278-4. Crosstalk compensation circuit 278-3 is implemented by overlapping conductive paths 174-3 and 174-7 and crosstalk compensation circuit 278-4 is implemented by overlapping conductive paths 174-2 and 174-6.

Third, in flexible printed circuit board 230, the inductive common mode crosstalk compensation circuits 278-3, 278-4 are implemented by running two traces together on opposite sides of the flexible printed circuit board 230, while in flexible printed circuit board 130 the inductive common mode crosstalk compensation circuits 178-3, 178-4 route the traces side-by-side on the same side of the printed circuit board 130. Notably, significantly higher amounts of inductive and capacitive coupling per unit length occur when the traces are run over top each other on opposite sides of the flexible printed circuit board, and hence shorter inductively coupling sections may be used. This shortens the delay at which the inductive common mode crosstalk compensation is injected, providing improved compensation.

Figure 8A:
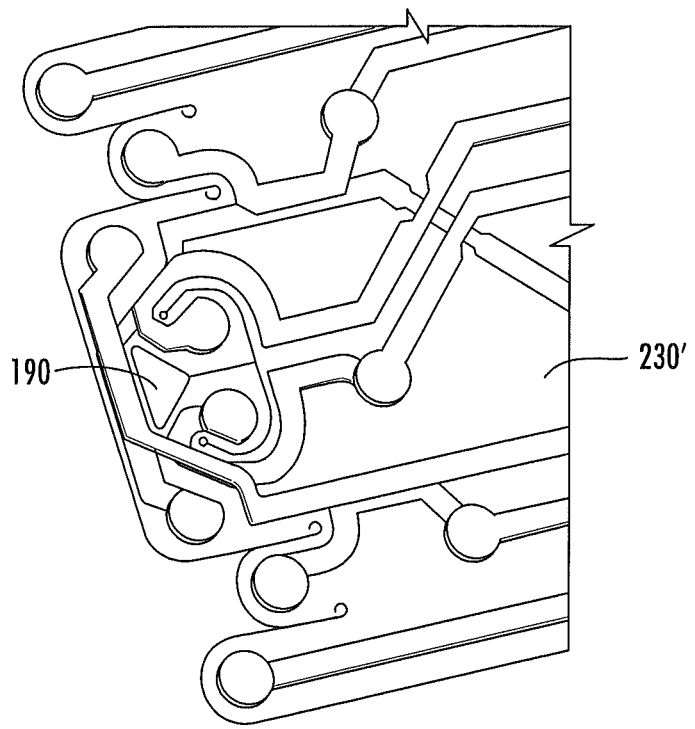
FIG. 8A is a schematic perspective view of a flexible printed circuit board according to additional embodiments of the present invention that may be used in the communications jack of FIG. 3.
Figure 8B:
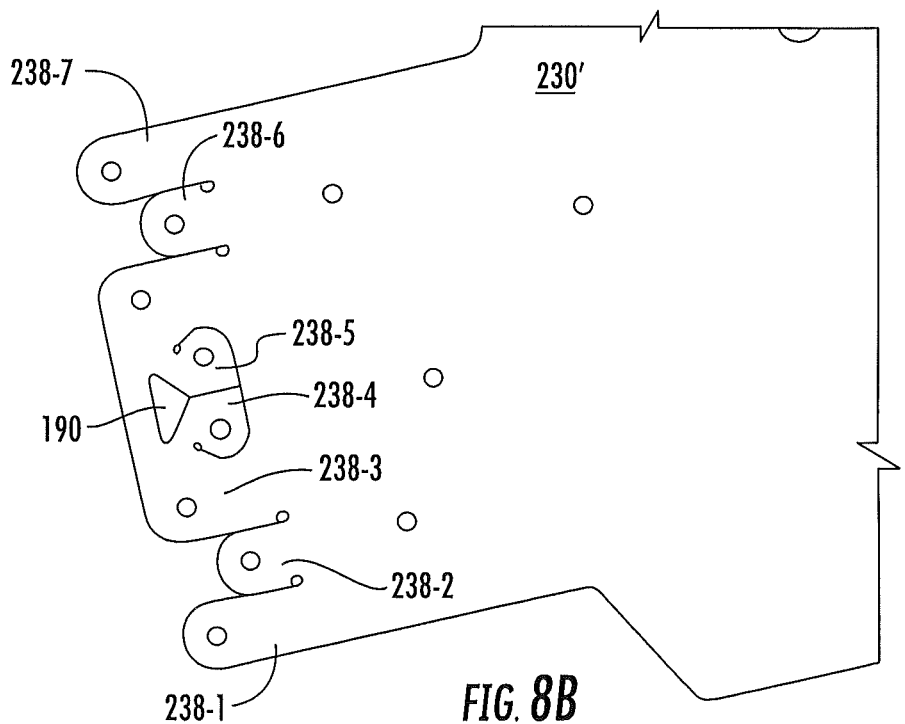
FIG. 8B is a schematic perspective view of the flexible printed circuit board of FIG. 8A with the traces removed.

FIG. 8A is a schematic perspective view of a portion of a flexible printed circuit board 230' according to further embodiments of the present invention. FIG. 8B is an identical view of the flexible printed circuit board 230' of FIG. 8A with the conductive traces and crosstalk compensation circuits omitted to more clearly illustrate the slit pattern in the printed circuit board that is used to form the cantilevered fingers/sections.

The flexible printed circuit board 230' may be used in place of the flexible printed circuit board 230 in the communications insert 120 of jack 100. The flexible printed circuit board 230' is almost identical to the flexible printed circuit board 230, except that the flexible printed circuit board 230' includes a cut-out area 190. This cut-out area 190 increases the mechanical independence of cantilevered fingers 238-4 and 238-5 with respect to cantilevered finger 238-3.

While in the flexible printed circuit boards 130, 230, 230' the metal-plated vias 139-12, 139-13 are each located on separate cantilevered fingers (e.g., cantilevered fingers 138-4, 138-5), it will be appreciated that in other embodiments both metal-plated vias 139-12, 139-13 may be located on a single same cantilevered finger by, for example, omitting the slit 137 between cantilevered fingers 138-4 and 138-5.

Figure 9A:
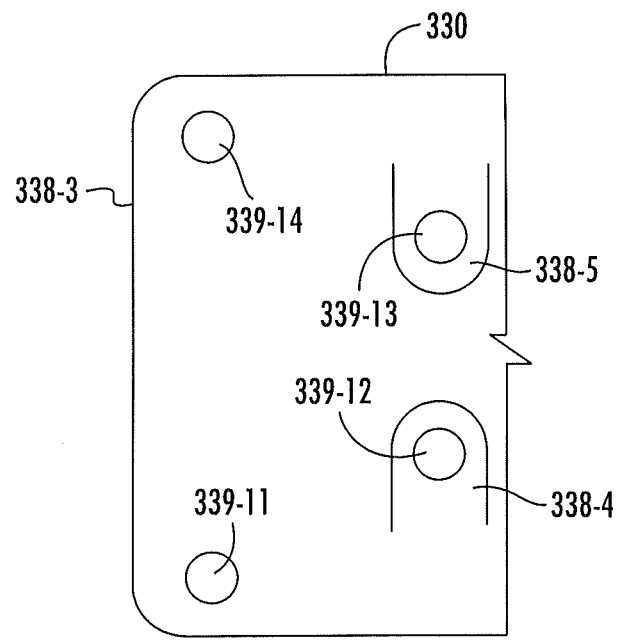
FIG. 9A is a schematic perspective view of a small portion of a flexible printed circuit board according to further embodiments of the present invention.
Figure 9B:
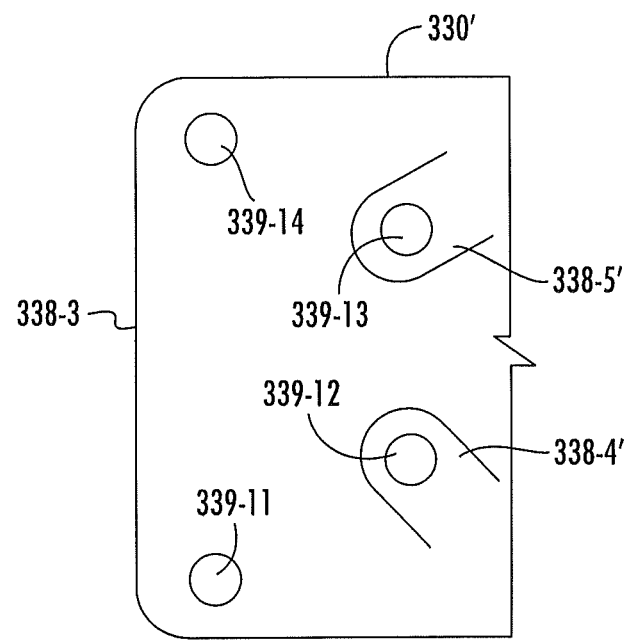
FIG. 9B is a schematic perspective view of a small portion of a flexible printed circuit board according to still further embodiments of the present invention.

FIG. 9A is a schematic perspective view of a small portion of a flexible printed circuit board 330 according to further embodiments of the present invention. FIG. 9B is a schematic perspective view of a small portion of a flexible printed circuit board 330' that includes a small modification as compared to flexible printed circuit board 330.

Figure 9C:
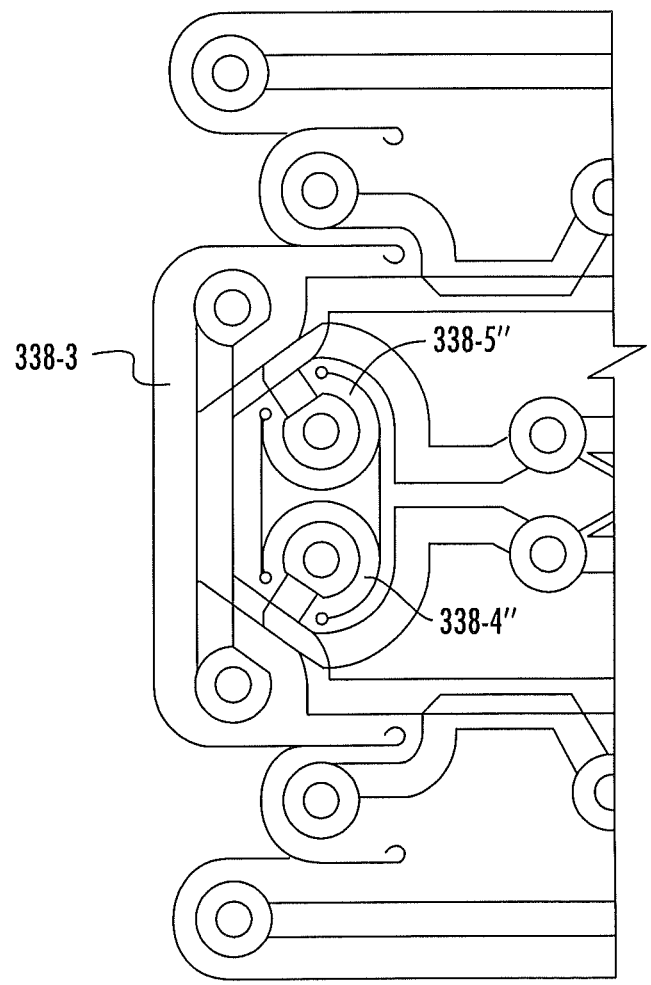
FIG. 9C is a schematic perspective view of a portion of a flexible printed circuit board according to still further embodiments of the present invention.

In particular, FIG. 9A illustrates the cantilevered sections 338-3, 338-4 and 338-5 of flexible printed circuit 330. These cantilevered sections 338-3, 338-4 and 338-5 may be used in place of cantilevered sections 138-3, 138-4 and 138-5, respectively, of the flexible printed circuit 130 of FIGS. 4A-4C. Otherwise, the flexible printed circuit board 330 may be identical to the flexible printed circuit board 130. As shown in FIG. 9A, the difference between the flexible printed circuit board 330 and the flexible printed circuit board 130 is that the cantilevered fingers 338-4 and 338-5 have each been rotated ninety degrees as compared to the cantilevered fingers 138-4 and 138-5. This illustrates that, for example, the cantilevered fingers for pair 1 may be disposed at a wide variety of angles, and need not face in the same direction as the cantilevered section for pair 3 (as is the case in the embodiment of FIGS. 4A-4C) or in the opposite direction as the cantilevered section for pair 3 (as is the case in the embodiment of FIGS. 7A-7B). FIG. 9B illustrates yet another embodiment where the cantilevered fingers 338-4' and 338-5' have each been rotated forty-five degrees as compared to the cantilevered fingers 138-4 and 138-5. FIG. 9C illustrates still another embodiment where the cantilevered fingers 338-4" and 338-5" have each been rotated forty-five degrees relative to the cantilevered fingers 338-4 and 338-5 of FIG. 9A, but in the opposite direction as compared to the cantilevered fingers 338-4' and 338-5' of FIG. 9B.

Various of the advantages of the communications jacks according to embodiments of the present invention can be seen by comparing, for example, the flexible printed circuit board 230 of FIGS. 7A-7B with the flexible circuit board designs disclosed in the aforementioned '078 application. The communications jacks in the '078 application may be designed or even optimized to provide for very rapid commencement of differential inductive crosstalk compensation between pairs 1 and 3. However, because of the design of the slits 137 and the arrangement of the vias 139-11 through 139-14 in these jacks, it would be difficult to, for example, route conductive path 174-3 next to conductive path 174-7 in the flexible printed circuit board 130 of FIG. 8 of the '078 application in order to provide an inductive common mode crosstalk compensation circuit that was at a relatively short delay from the jackwire contacts.

As shown above, pursuant to embodiments of the present invention, inductive common mode crosstalk compensation circuits may be provided that are at relatively short delays from the jackwire contacts. These circuits may facilitate achieving significantly improved alien crosstalk performance, and hence may allow for the use of unshielded jacks and cabling. While the improved alien crosstalk performance may slightly degrade the differential crosstalk performance of the jack, for many categories of jacks this slight degradation may not matter since more than sufficient internal crosstalk margin may exist.

While various of the above-described communications jacks include a flexible printed circuit board that may be cut in two to form two flexible printed circuit boards, it will be appreciated that embodiments of the present invention are not limited to such an implementation. For example, in some embodiments, the flexible printed circuit board may not be cut so that the jack includes a single flexible printed circuit board. In other embodiments, a flexible printed circuit board may hold, for example, the rear ends of the jackwire contacts (i.e., the ends that are closest to the IDCs) while a conventional printed circuit board may hold the front ends of the jackwire contacts. In still other embodiments, a flexible printed circuit board may hold, for example, the rear ends of the jackwire contacts while the front ends of the jackwire contacts may be mounted in another mounting substrate such as, for example, a piece of the jack housing or a dielectric block. In still other embodiments, one or more composite flexible printed circuit boards may be used such as, for example, a rigid/flex printed circuit board that has a flexible portion and a rigid portion. For example, the flexible printed circuit board that receives the rear ends of the jackwire contacts could be implemented using a rigid/flex printed circuit board instead, with the flexible portion receiving the rear ends of the jackwire contacts and the rigid portion receiving the IDCs or other output terminals. This may simplify mechanically and electrically connecting the output terminals to the printed circuit board and/or provide a more robust connection between the output terminals and the printed circuit board. It will also be appreciated that more than two printed circuit boards may be used and that not all of the front (or rear) ends of the jackwire contacts need be mounted in the same printed circuit board or other mounting substrate.

While embodiments of the present invention have primarily been discussed herein with respect to communications jacks that include eight conductive paths that are arranged as four differential pairs of conductive paths, it will be appreciated that the concepts described herein are equally applicable to jacks that include other numbers of differential pairs.

While the present invention has been described above primarily with reference to the accompanying drawings, it will be appreciated that the invention is not limited to the illustrated embodiments; rather, these embodiments are intended to fully and completely disclose the invention to those skilled in this art. In the drawings, like numbers refer to like elements throughout. Thicknesses and dimensions of some components may be exaggerated for clarity.

Spatially relative terms, such as "under", "below", "lower", "over", "upper", "top", "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity. As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, operations, elements, and/or components, but do not preclude the presence or addition of one or more other features, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Herein, the terms "attached", "connected", "interconnected", "contacting", "mounted" and the like can mean either direct or indirect attachment or contact between elements, unless stated otherwise.

Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A communications jack, comprising:
a housing having a front end and a back end that is opposite the front end, wherein a plug aperture is provided in the front end of the housing;
a flexible printed circuit board that is at least partly within the housing;
first through eighth input contacts that are mounted on the flexible printed circuit board, the fourth and fifth input contacts forming a first differential pair of input contacts, the first and second input contacts forming a second differential pair of input contacts, the third and sixth input contacts forming a third differential pair of input contacts, and the seventh and eighth input contacts forming a fourth differential pair of input contacts, each of the first through eighth input contacts including a plug contact region, the plug contact regions of the first through eighth input contacts being arranged in numerical order across the plug aperture;
first through eighth output contacts that are electrically connected to the flexible printed circuit board, the flexible printed circuit board further including first through eighth conductive paths that electrically connect the respective first through eighth input contacts to the respective first through eighth output contacts; and
first through eighth dielectric contact carriers,
wherein the first through eighth input contacts are mounted through the flexible printed circuit board into respective ones of the first through eighth dielectric contact carriers,
wherein the fourth and fifth input contacts are mounted on the flexible printed circuit board at respective first and second mounting locations that are closer to the back end of the housing than are respective third and fourth mounting locations where the third and sixth input contacts are mounted on the flexible printed circuit board.

2. The communications jack of claim 1, wherein the third conductive path crosses over the sixth conductive path.

3. The communications jack of claim 1, wherein a portion of the third conductive path is configured to inductively couple with a portion of the seventh conductive path and/or with a portion of the eighth conductive path.

4. The communications jack of claim 1, wherein a portion of the sixth conductive path is configured to inductively couple with a portion of the second conductive path and/or with a portion of the first conductive path.

5. The communications jack of claim 1, wherein the communications jack comprises an RJ-45 jack, the RJ-45 jack further comprising a second printed circuit board, wherein at least some of the first through eighth input contacts are also mounted on the second printed circuit board.

6. The communications jack of claim 1, further comprising a capacitive crosstalk compensation circuit that is connected between a non-signal current carrying end of the third input contact and a non-signal current carrying end of the fifth input contact and/or between a non-signal current carrying end of the fourth input contact and a non-signal current carrying end of the sixth input contact.

7. The communications jack of claim 1, further comprising a spring, wherein at least the first dielectric contact carrier is interposed between the first input contact and the spring.

8. The communications jack of claim 1, wherein the flexible printed circuit board has a first cantilevered section and a second cantilevered section, and wherein the third and fourth mounting locations are on the first cantilevered section, and at least one of the first and second mounting locations is on the second cantilevered section.

9. The communications jack of claim 8, wherein the first cantilevered section is cantilevered in a first direction and the second cantilevered section is cantilevered in a second direction that is rotated from the first direction by at least forty-five degrees.

10. The communications jack of claim 8, further comprising an inductive crosstalk compensation circuit that is located on the first cantilevered section, and wherein the inductive crosstalk compensation circuit generates inductive compensating crosstalk between the first differential pair of input contacts and the third differential pair of input contacts.

11. A communications jack, comprising:
a housing having a front end and a back end that is opposite the front end, wherein a plug aperture is provided in the front end of the housing;
a flexible printed circuit board that is at least partly within the housing;
first through eighth input contacts that are mounted on the flexible printed circuit board, the fourth and fifth input contacts forming a first differential pair of input contacts, the first and second input contacts forming a second differential pair of input contacts, the third and sixth input contacts forming a third differential pair of input contacts, and the seventh and eighth input contacts forming a fourth differential pair of input contacts, each of the first through eighth input contacts including a plug contact region, the plug contact regions of the first through eighth input contacts being arranged in numerical order across the plug aperture;
first through eighth output contacts that are electrically connected to the flexible printed circuit board, the flexible printed circuit board further including first through eighth conductive paths that electrically connect the respective first through eighth input contacts to the respective first through eighth output contacts,
wherein the fourth and fifth input contacts are mounted on the flexible printed circuit board at respective first and second mounting locations that are closer to the back end of the housing than are respective third and fourth mounting locations where the third and sixth input contacts are mounted on the flexible printed circuit board, and
wherein front ends of the second, fourth, fifth and seventh input contacts are substantially aligned in a first row, and wherein front ends of the third and sixth input contacts are substantially aligned in a second row that is offset from the first row.

12. A communications jack, comprising:
first and second jackwire contacts that form a first differential pair of jackwire contacts;
third and fourth jackwire contacts that form a second differential pair of jackwire contacts;
a flexible substrate that has a first cantilevered section and a second cantilevered section,
wherein the first and second jackwire contacts are mounted on the first cantilevered section,
wherein the third jackwire contact is mounted on the second cantilevered section, and
wherein the first cantilevered section is a unitary portion of the flexible substrate that extends from a main body of the flexible substrate and the second cantilevered section is separate from the first cantilevered section.

13. The communications jack of claim 12, wherein the fourth jackwire contact is mounted on the second cantilevered section.

14. The communications jack of claim 12, wherein the flexible substrate further includes a third cantilevered section, and the fourth jackwire contact is mounted on the third cantilevered section.

15. The communications jack of claim 12, wherein the second cantilevered section is within the first cantilevered section.

16. The communications jack of claim 12, wherein the first cantilevered section is cantilevered in a first direction and the second cantilevered section is cantilevered in a second direction that is different from the first direction.

17. The communications jack of claim 12, wherein the first cantilevered section surrounds the second cantilevered section.

18. The communications jack of claim 12, wherein the communications jack comprises an RJ-45 communications jack that further includes fifth and sixth jackwire contacts that form a third differential pair of jackwire contacts and seventh and eight jackwire contacts that form a fourth differential pair of jackwire contacts.

19. The communications jack of claim 12, wherein the first cantilevered section has a first base that connects to a main section of the flexible substrate, a second base that connects to the main section of the flexible substrate and that is spaced apart from the first base, and a jackwire contact mounting section that extends between the first base and the second base.

20. The communications jack of claim 12, wherein the first cantilevered section of the flexible substrate includes a first conductive path that electrically connects to the first jackwire contact and a second conductive path that electrically connects to the second jackwire contact, and wherein the first and second conductive paths cross on the first cantilevered section.

21. The communications jack of claim 12, wherein the first cantilevered section is a generally U-shaped cantilevered section.

22. A communications jack, comprising:
first and second jackwire contacts that form a first differential pair of jackwire contacts;
third and fourth jackwire contacts that form a second differential pair of jackwire contacts;
a flexible substrate that has a first cantilevered section and a second cantilevered section,
an inductive crosstalk compensation circuit that is located on the first cantilevered section,
wherein the first and second jackwire contacts are mounted on the first cantilevered section.

* * * * *